United States Patent [19]

Anderson et al.

[11] Patent Number: 4,660,150

[45] Date of Patent: Apr. 21, 1987

[54] SPECTRUM ANALYZER WITH IMPROVED DATA ANALYSIS AND DISPLAY FEATURES

[75] Inventors: Gregory A. Anderson; Paul M. Eason, both of Santa Rosa; Michael S. Marzalek, Petaluma; Lynn M. Wheelwright, Santa Rosa, all of Calif.

[73] Assignee: Hewlett-Packard Company, Palo Alto, Calif.

[21] Appl. No.: 580,991

[22] Filed: Feb. 16, 1984

[51] Int. Cl.$^4$ .................. G01R 23/16; G01R 23/00
[52] U.S. Cl. ...................... 364/485; 364/487; 324/77 B; 73/659
[58] Field of Search ............ 364/485, 487, 518, 521, 364/579; 324/77 B, 77 D, 57 SS; 73/659

[56] References Cited

U.S. PATENT DOCUMENTS

| Re. 31,750 | 11/1984 | Morrow | 73/659 |
|---|---|---|---|
| 3,544,894 | 12/1970 | Hartwell et al. | 364/485 X |
| 3,641,515 | 2/1972 | Sues | 364/485 |
| 3,904,959 | 9/1975 | Britton, Jr. | 324/57 SS |
| 3,999,004 | 11/1976 | Newton | 324/57 |
| 4,090,126 | 5/1978 | Poticha et al. | 324/57 SS |
| 4,244,024 | 1/1981 | Marzalek et al. | 364/485 |
| 4,253,152 | 2/1981 | Holdaway | 364/485 |
| 4,255,790 | 3/1981 | Hondeghem | 364/485 |
| 4,257,104 | 3/1981 | Martin et al. | 364/485 |
| 4,264,958 | 4/1981 | Rowell, Jr. et al. | 364/485 |
| 4,321,528 | 3/1982 | Reichel et al. | 324/77 B X |
| 4,399,512 | 8/1983 | Soma et al. | 364/487 |
| 4,533,866 | 8/1985 | Zirwick | 324/77 B |

OTHER PUBLICATIONS

Bliss et al., "A Low-Cost Spectrum Analyzer from Basic Modules" *Electronic Engineering*, Dec. 1970, pp. 45-47.

Kraus, K. "Programmable Frequency Selector" *Electronic Engineering*, vol. 49, No. 588, p. 24, Feb. 1977.

Klein, A. "Microprocessors Continue to Add Versatility to New Test Instrumentation" *Control Engineering*, Jul. 1978, pp. 41-42.

*Primary Examiner*—Errol A. Krass
*Assistant Examiner*—Joseph L. Dixon
*Attorney, Agent, or Firm*—Patrick J. Barrett

[57] ABSTRACT

An automatic spectrum analyzer is provided with enhanced features for measured data handling and analysis. One feature allows the user to establish a sequence of operations to be performed at the end of each sweep of the instrument. Another feature enables the user to specify a particular signal amplitude and to have a marker placed on a displayed signal trace at that amplitude. Still another feature provides a marker that can be positioned on the next signal peak to the right or the left of the current marker position, enabling the display of the amplitude and frequency of the signal on which the marker is placed.

2 Claims, 24 Drawing Figures

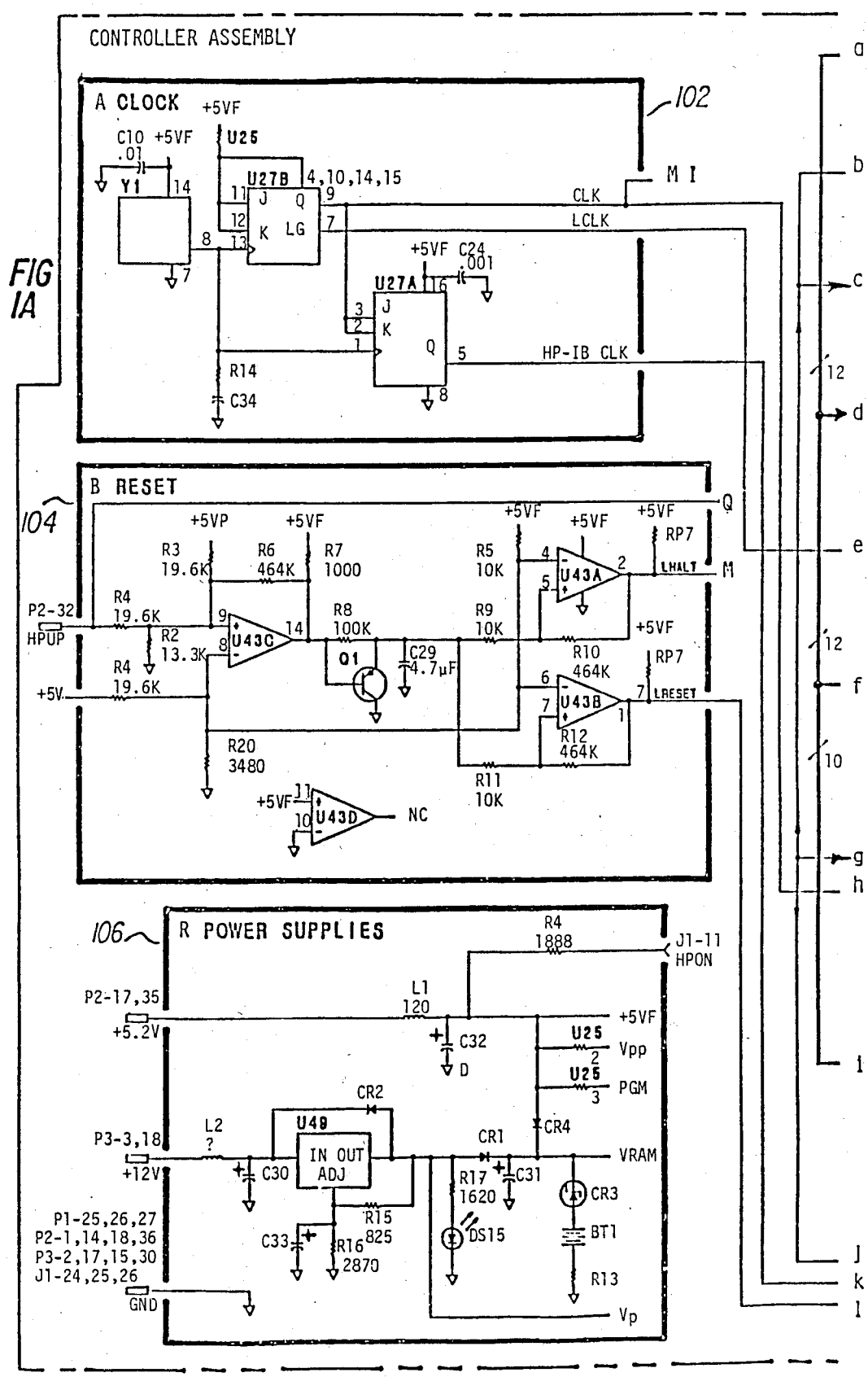

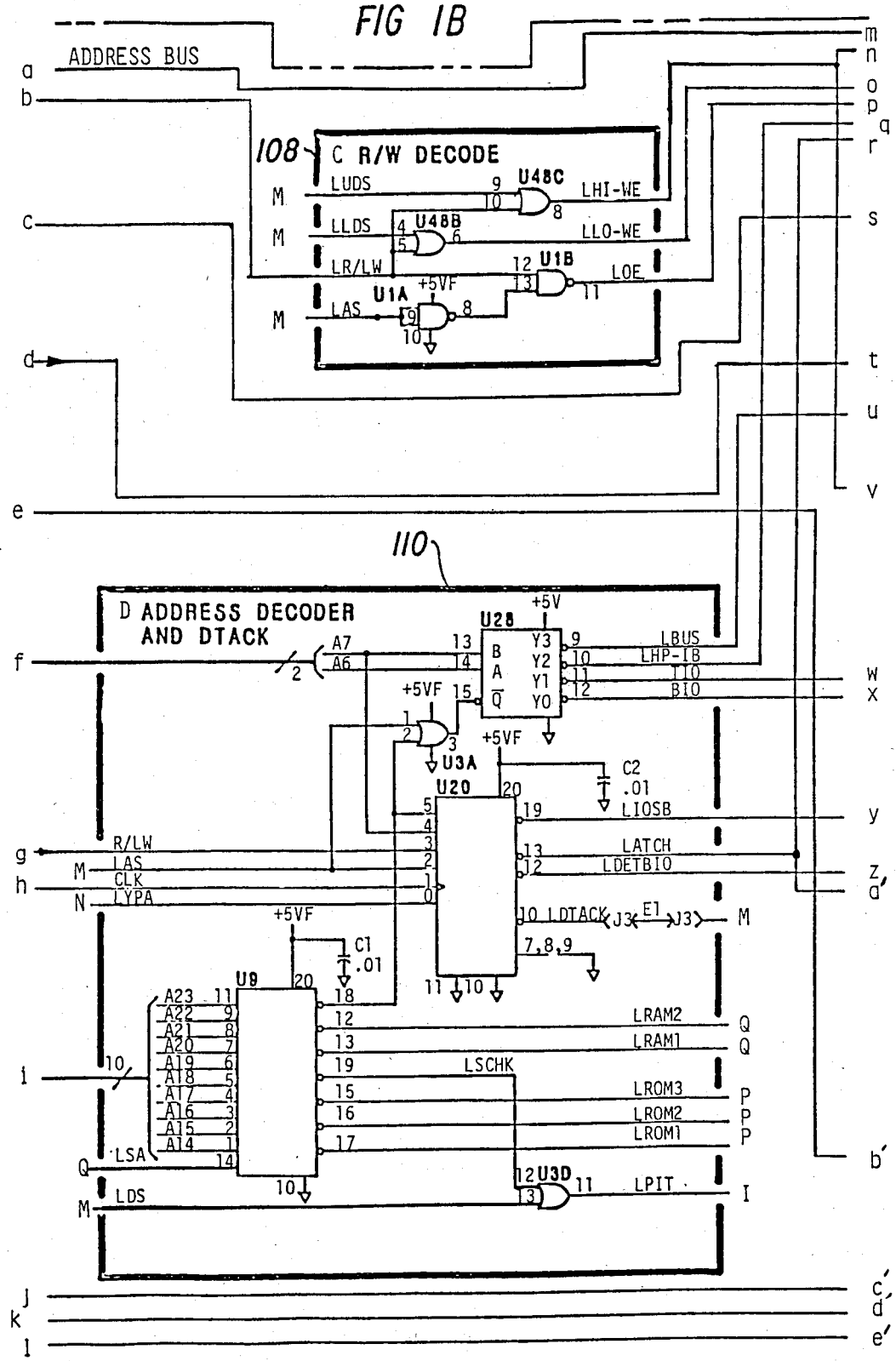

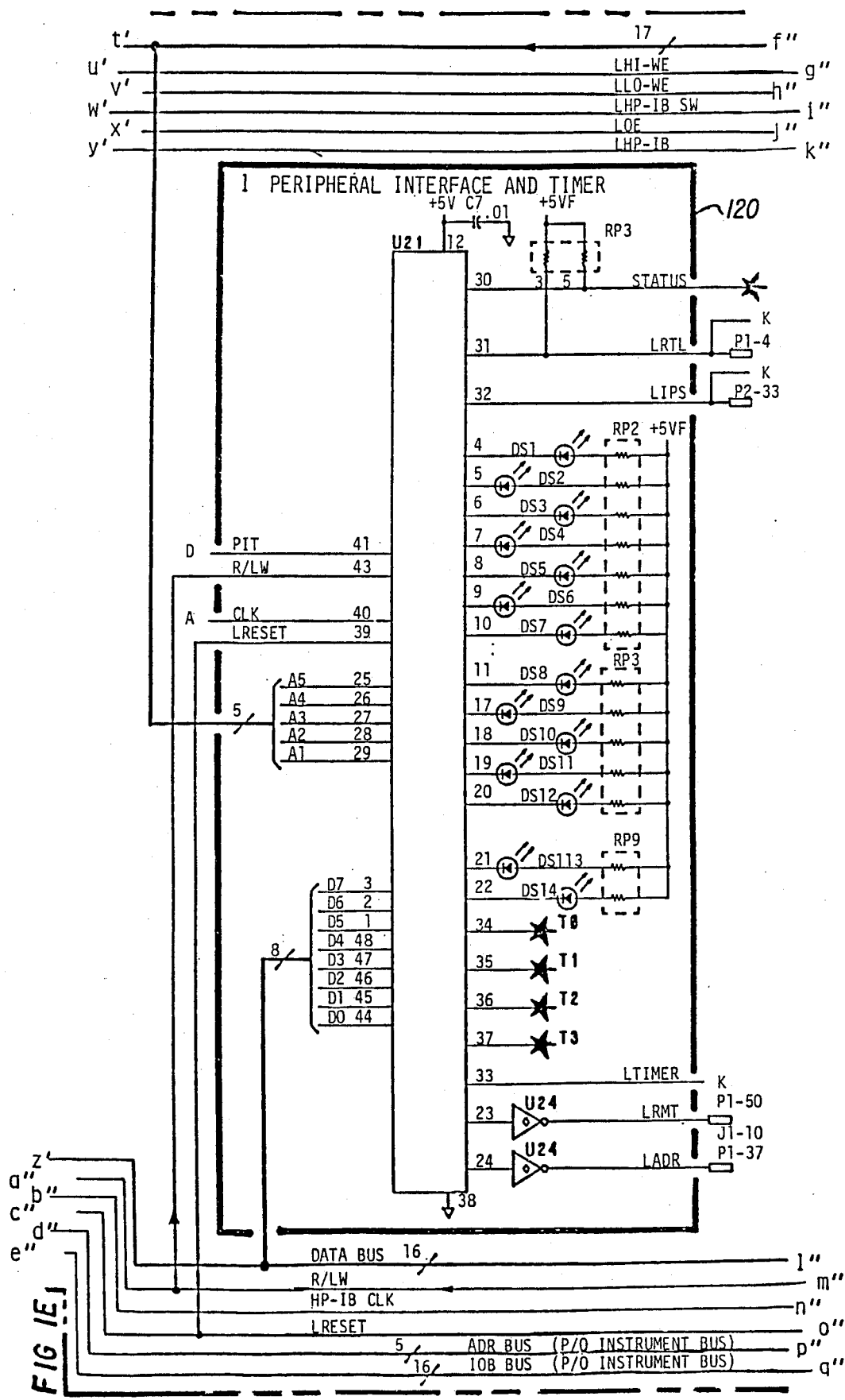

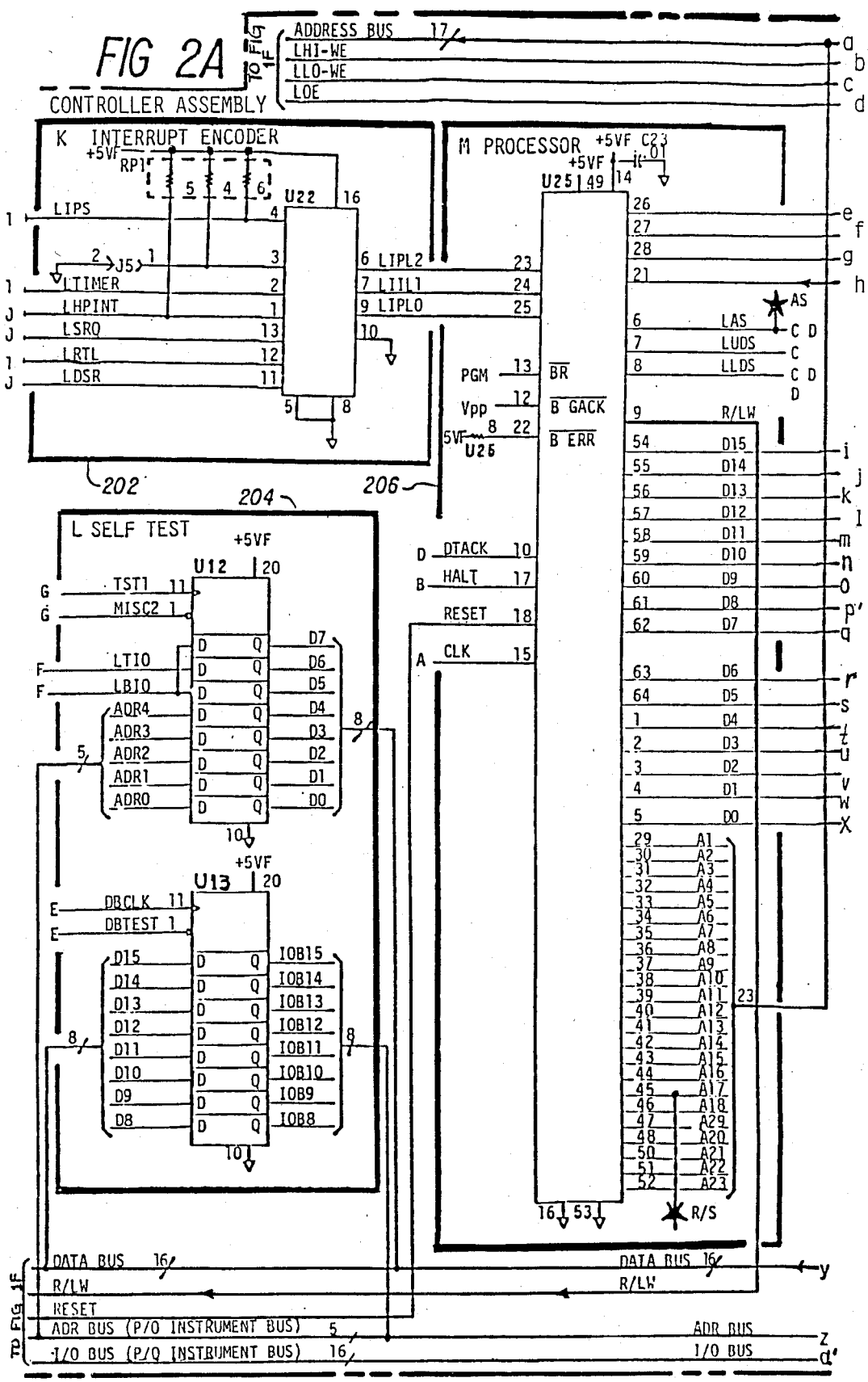

SPECTRUM ANALYZER WITH IMPROVED DATA ANALYSIS AND DISPLAY FEATURES

BACKGROUND OF THE INVENTION

A spectrum analyzer is essentially a receiver that is tuned or swept across a band of frequencies, and the amplitude of received signals is displayed on a cathode ray tube as a function of frequency. It is often desirable to make adjustments to the displayed signal information for the purposes of calibration, and it is also desirable to quantify the characteristics of the displayed information such as signal magnitude and frequency. These functions are most effectively performed if the information is converted from analog form to digital form and stored in a memory. Such digitization of the information also facilitates the automation of spectrum analyzer functions.

An automatic spectrum analyzer is disclosed in U.S. Pat. Nos. 4,253,152; 4,264,958; 4,257,104; and 4,244,024 which has a number of advanced data handling and analysis features, several of them connected with markers that can be placed on the display screen. These features allow the user to determine, for example, the frequency and amplitude of a particular point on a signal trace in the display where he has placed a marker. The user can also request the marker to be placed at the highest signal shown in the display with a peak search function, and the display will show the frequency and amplitude of the point found by the search. Another prior art spectrum analyzer, the Hewlett-Packard model 8566A, had an additional feature that allowed the user to have a marker placed on the next highest peak.

Another feature of the prior art device allows the user to specify a particular frequency on the display and then to cause a marker to be placed on the signal trace in the display at that frequency. The spectrum analyzer will then display the amplitude of the signal at the chosen frequency.

The prior art spectrum analyzer can be controlled from a keyboard on the front panel of the instrument or from a remote computer connected to the analyzer by the Hewlett-Packard Interface Bus (HP-IB). Using commands that represent functions available from the front panel of the instrument, a remote computer can thus programmatically control the spectrum analyzer.

SUMMARY OF THE INVENTION

The preferred embodiment of the present invention is an improvement on the prior art spectrum analyzer referenced above and provides a number of functions that are not available in the prior art spectrum analyzer. These new functions provide significant advantages in the acquisition and use of spectrum analyzer data.

One of these new functions provides for the automatic execution of user defined functions at the end of each sweep of the spectrum analyzer. In the prior art, further processing of data from the spectrum analyzer by the user essentially had to be done by or under the command of an external computer, and there was a time delay associated with such processing. In the preferred embodiment of the present invention, processing can be done much more quickly since it is done by the spectrum analyzer itself when it reaches the end of a sweep. This function, for example, allows the user to cause the analyzer to indicate if the results of a test being performed are out of bounds set by the user or if a particular signal being sought has been found.

Another new function provided allows the user to specify a particular signal amplitude and request a marker be placed on the displayed signal at that amplitude. This amplitude marker function greatly facilitates the testing of electronic devices such as filters and amplifiers and also aids in the location or identification of signals. It is a significant improvement over the previously available feature that allowed only the manual placement of a marker on the display or the specification of the frequency at which a marker was to appear, because it essentially eliminates trial and error attempts to find specific signal amplitudes.

Frequently a number of signals of varying magnitudes will be displayed on the screen of a spectrum analyzer, and the user will want to determine the frequency and amplitude of each one. A prior art device provides a convenient function for placing a marker on the highest signal and displaying the frequency and amplitude of that signal. A next highest marker function can be used to measure each of the other signals in the order of their magnitudes. However, since the amplitudes of the signals may have no relationship with their order on the display, the marker may jump around on the screen in an inconvenient way as it is moved from signal to signal.

One of the new features of the preferred embodiment allows the user to cause the spectrum analyzer to place the marker on the next peak to the right or the left of the current marker position. By providing a next peak left or next peak right marker function, the preferred embodiment of the present invention provides a significantly improved way to measure the frequency and amplitude of each signal in the order it appears on the display.

BRIEF DESCRIPTION OF THE DRAWINGS

FIGS. 1A–1F and 2A–2E are schematic diagrams of a controller assembly for a spectrum analyzer in accordance with the preferred embodiment of the present invention.

DETAILED DESCRIPTION OF THE PREFERRED EMBODIMENT

Figure 1:
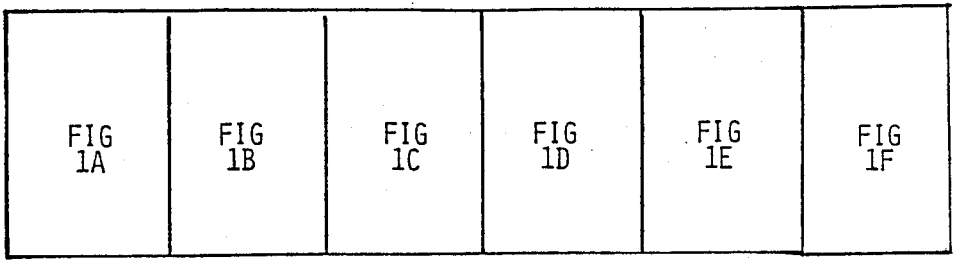
FIGS. 1 and 2 show the combination of FIGS. 1A–1F and 2A–2E respectively.

The present invention comprises improvements on the apparatus disclosed in U.S. Pat. No. 4,253,152, which is incorporated herein. That apparatus comprised a spectrum analyzer with circuits for digitizing measured analog signals and for displaying and analyzing the digitized signals in various ways. The following description is of those aspects of the preferred embodiment of the present invention that differ from the prior embodiment. The first difference is in the controller assembly, shown in FIGS. 38 and 39 of the prior patent and described principally starting at column 24, line 65 and continuing through column 25, line 47 thereof.

FIGS. 1A–1F and 2A–2E show the controller assembly of the preferred embodiment which replaces the controller assembly of the prior patent. Components shown in block form in these figures are identified in Appendix III. Block 102 is a clock with a crystal oscillator that runs at approximately 14.7 megaherz. The oscillator output signal is divided once for the processor clock signal and twice for the clock to run the HP-IB chip.

A reset circuit 104 verifies that power supply 106 is within tolerance before the processor starts operating so there is not an inadvertent loss or destruction of memory contents. Read/write decode buffering circuits 108 provide buffers for the memories (RAM and ROM) to enable high bite or low bite select outputs.

An address decoder 110 comprises some standard type decoders (models LS139 and LS138) and a couple of programmable array logic type decoders that do the ROM and RAM addressing. Address decoder 112 provides address decoding for several other circuits in the controller assembly, such as a parallel interface timer chip, an HP-IB chip and data bus buffers that buffer the instrument bus. The buffers are shown in block 114, and these buffers isolate the instrument bus from the processor data bus to protect from RFI inside the instrument. The output of those buffers is what drives the rest of the instrument. The buses and the types of signals available on those buses are the same as those in the apparatus described in the prior patent.

Block 116 includes buffer controls for the buffers in block 114. Block 118 has strobe generators for the input/output (I/O) bus to select between the display section and the RF section, each of which has its own set of addresses.

A peripheral interface and timer chip 120 is used to take care of some miscellaneous control lines and to drive some LEDs for signature analysis for fault diagnosis.

In block 122 is a Hewlett-Packard Interface Bus (HP-IB) chip along with two buffer chips. In addition, there is a set of address switches and a buffer U14 (an LS244) to read them back on to the processor data bus.

Block 202 is an interrupt decoder (an LS148). Self test block 204 includes some registers that are used in a self-test procedure check. These are registers where one can read an address in and then write them back out on the data bus to find out if they are really what they ought to be.

A microprocessor 206 is used to control the operation of the spectrum analyzer. A Motorola model 68000 microprocessor running at 8 megahertz is used instead of processor 2015 shown in FIG. 38A of the prior patent. The model 68000 microprocessor is a standard, commercially available one; and the instruction set for this microprocessor can be found in any number of published books, such as "MC68000 16-Bit Microprocessor User's Manual," third edition, 1982, published by Prentiss-Hall.

Since the microcode instruction set for this processor is different from the instruction set for the processor disclosed in the prior patent, the programs given in the appendices of the prior patent have been recompiled to run on the MC68000 microprocessor. However, all of the functions disclosed in the prior patent are also performed by the present embodiment in essentially the same manner, taking into account the differences between the two processors and their instruction sets. It should be noted that the processor reset signal referred to as POP in the prior patent is now called RESET in this embodiment, and the starting address of 40 for program execution has now been changed to 0. It should also be noted that the HSTM line is no longer used; and a stop circuit 3801 is no longer needed, this function now being performed by the microprocessor.

Block 208 comprises some interrupt decoding logic, and block 210 comprises some signature analysis jumpers that can be connected in such a way to force microprocessor 206 to perform a number of preselected operations repetitively for diagnostic purposes.

Block 212 contains read only memories (ROMs) that contain the programs for the various functions performed by the spectrum analyzer. These programs include those disclosed in the prior patent and those disclosed below. Block 214 contains random access memory (RAM) where data gathered by the spectrum analyzer as well as the results of data manipulations and various alterable parameters and instructions are stored. Both the RAM and ROMs are included on the same circuit board with the microprocessor rather than on separate circuit boards as in the device of the prior patent.

While the foregoing controller assembly using the MC68000 microprocessor is disclosed as the preferred embodiment, it will be understood by those skilled in the art that the following programs could just as easily be used in the embodiment disclosed in the prior patent by compiling them to run on the processor in that embodiment.

Figure 3:
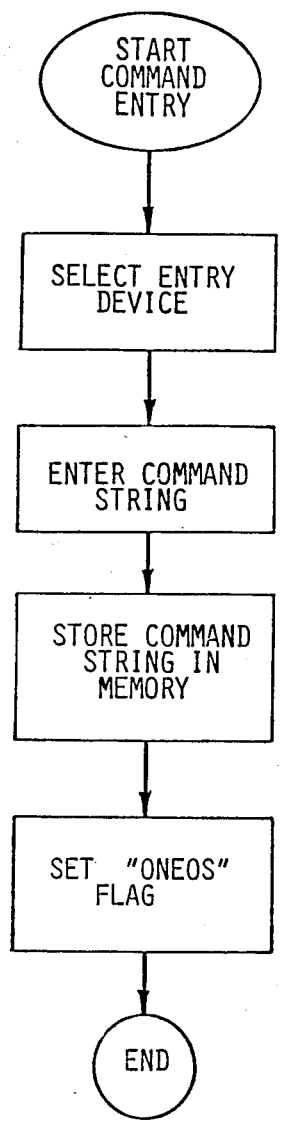
FIGS. 3 and 4 are flow diagrams of a function for performing user defined programs at the end of a sweep of the spectrum analyzer.
Figure 4:
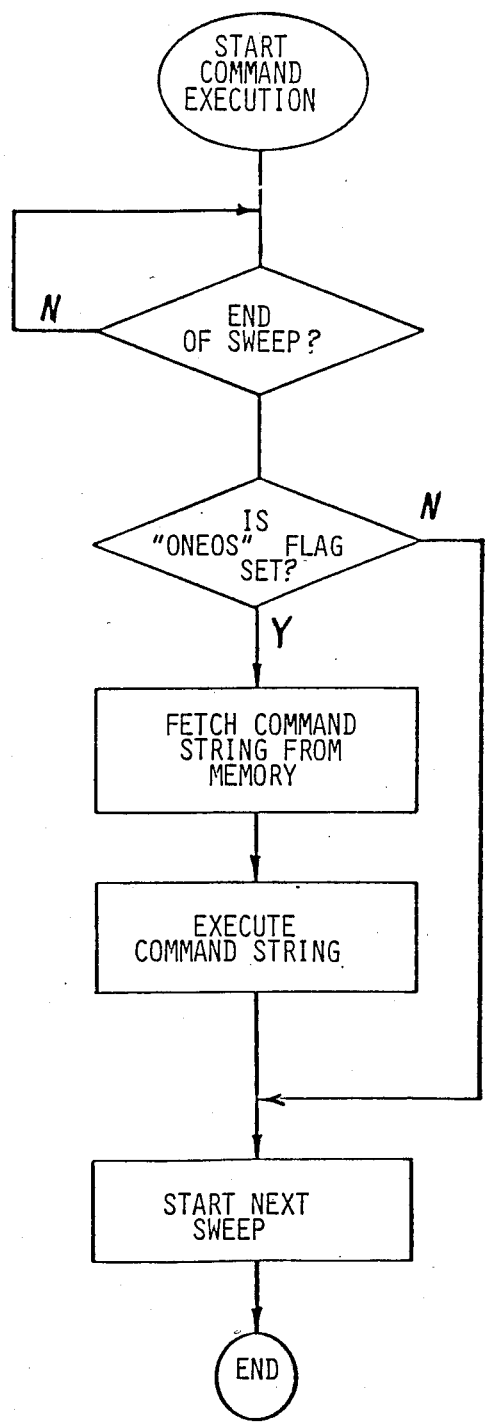

FIGS. 3 and 4 show flow diagrams for a function that automatically performs a user defined program at the end of each sweep of the spectrum analyzer. For simplicity, this function is referred to as "on end of sweep" or ONEOS.

The ONEOS feature actually comprises two temporally separate functions. One is the entry of a string of standard remote commands into the spectrum analyzer by the user. The spectrum analyzer stores those commands in memory for later use, and sets a flag in memory to indicate that such a command string has been stored. The other function occurs thereafter at the end of every sweep of the spectrum analyzer, when the spectrum analyzer accesses the command string and performs the commands. Examples of these command strings are limit checking and reprogramming the center frequency of the instrument. Any legal spectrum analyzer command can be put in the command string.

FIG. 3 shows the command string entry sequence. First the user selects an entry device, typically the keyboard of a remote computer connected to the spectrum analyzer through HP-IB, although it is possible to enter such command strings from the spectrum analyzer front panel as well. The command string is entered by first entering a command "ONEOS" followed by a string of commands in double quotes for the spectrum analyzer to perform. The string of commands is then stored in the spectrum analyzer memory and a flag is set saying that this command string has been entered.

An example of such a command string is the following:

ONEOS "MKPK HI; IF MA, LT, −30 THEN
TEXT 'SIGNAL TOO LOW'; SRQ 1; ENDIF;"

This command string causes a marker peak search to be done and then to test the amplitude that the marker found to see if it is less than −30 dBm. If it is below that level, then the spectrum analyzer displays on the screen the message "SIGNAL TOO LOW" to alert the operator to the undesirable condition, so the operator can take appropriate action. It also generates a service request through the remote port on HP-IB to notify a controller that something is wrong so it can give an alarm or take other predetermined action.

FIG. 4 is a flow diagram of the procedure for checking whether there is an ONEOS command string to be performed and causing it to be performed if there is one. In the spectrum analyzer programming there is a routine that runs all the time, which, every time the analyzer comes to an end of a sweep, restarts the sweep. It is called DOEOS and is listed at lines 125 through 140 in Appendix II. In that routine there is a check made to see if the ONEOS flag has been set, indicating that the ONEOS command has been entered. If it has been entered, a procedure called DOSOFTKEY(−1) (lines 553-567 in Appendix II) is called and the command string is passed to the HP-IB command interpreter to be executed as if it were any remote set of commands. When the execution of the command string is complete, the next sweep is then started. This process then runs on a continuous basis.

It should be noted that the ONEOS function is useful not only in spectrum analyzers, but in other types of swept frequency measurement instruments. One example would be automatic network analyzers that have built-in processors or controllers analogous to the controller in the preferred embodiment.

Figure 5A:
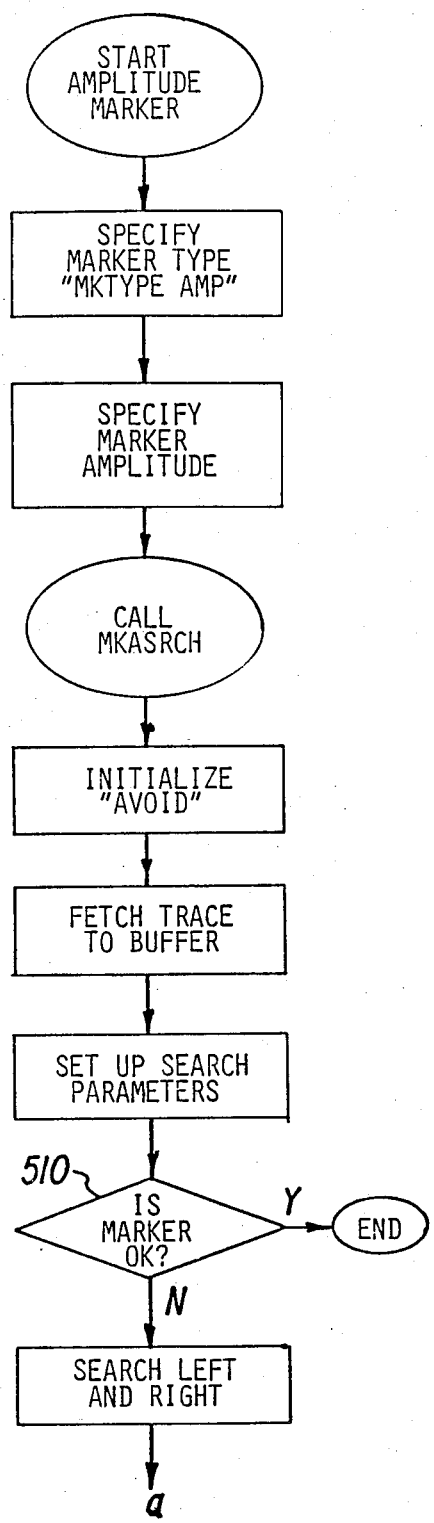
FIGS. 5A–5B show a flow diagram of an amplitude marker function.
Figure 5B:
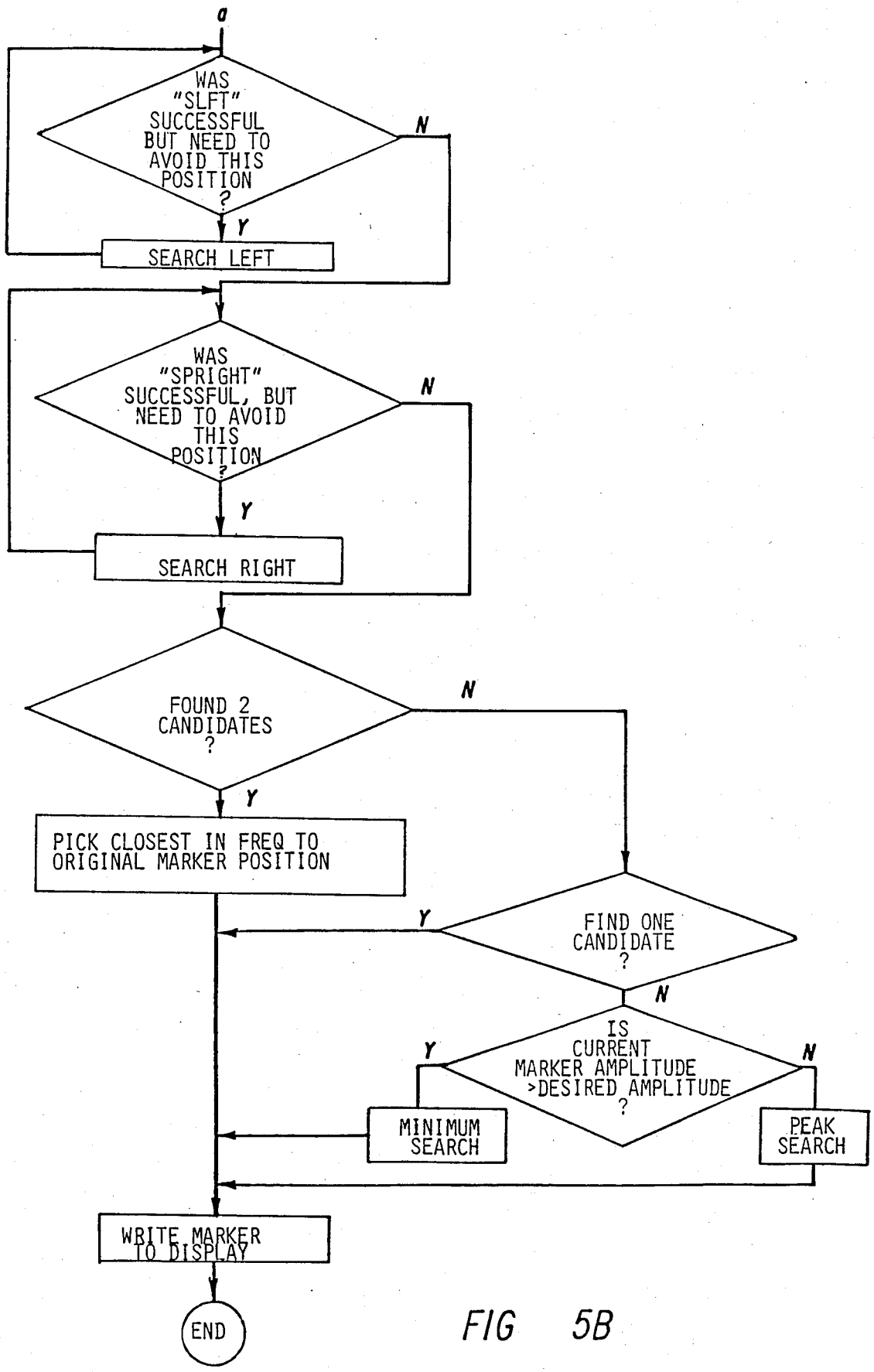
Figure 6:
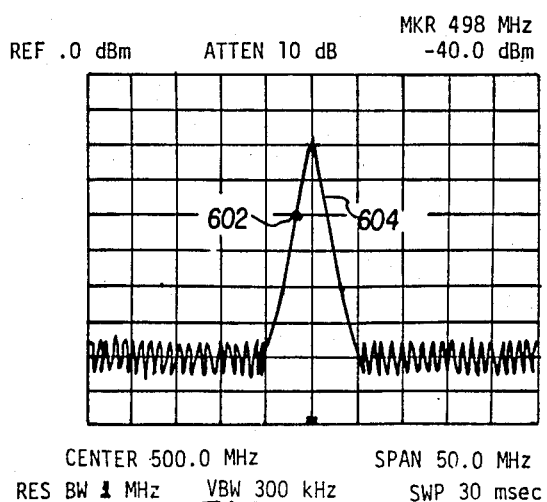
FIG. 6 illustrates the operation of the amplitude marker function of FIG. 5.

Another function performed by the preferred embodiment is the placing of a marker on a trace on the spectrum analyzer display at a specified amplitude. This amplitude marker function is illustrated in the flow diagrams in FIGS. 5A-5B and the result of the function is illustrated in FIG. 6.

The function is invoked by first specifying a marker of type "amplitude," and this sets the mode of operation. Next the amplitude level at which the marker is to be placed is specified, and the spectrum analyzer places the marker at that amplitude on the data trace on the screen (if it can find it). If it cannot find a trace that passes through that amplitude, it finds the closest thing to it so if everything is above or everything is below, it will find the highest spot or the lowest spot on the trace respectively.

The search routine for the marker is called MKASRCH in the flow charts and in the supporting program listings (see lines 107 and following in Appendix I). At the beginning of the routine some parameters are initialized, including an array called AVOID (see lines 155-209 in Appendix I). This array specifies positions on the display that are to be avoided so that the marker is not set on top of other markers that already exist. Next, the displayed trace is fetched and loaded into the buffer where it can be worked on. Once that is accomplished, some initial search parameters are initialized. In particular, the current marker position and amplitude as well as the amplitude that is being looked for are set up.

At the beginning of the search a test is made in decision block 510 to find out if the marker really has to be moved at all or if it is already at the desired amplitude. If the answer is yes, the search is done, and nothing more needs to be done. Normally that is not the case, so the search left and right from the current marker position routine is started. The purpose of this search is to search both sides of the current marker position to see if the trace crosses the desired amplitude level anywhere on the display. First the search proceeds in one direction to the edge of the screen and then in the other direction to the other edge of the screen, unless a point satisfying the search condition is found before the edge of the screen is reached.

The program for the search left and search right routines is given at lines 116 through 153 of Appendix I. The search proceeds one data value at a time. Each data value is fetched one at a time to find out if it is greater than or less than the desired value. The program looks for something that either equals the desired value or crosses through the desired value from one point to the next. If the data value is initially greater than the desired value, then the program is looking for something less than or equal to the desired value. When that is found, then the trace has crossed through the desired value between these two digitized points. Once a candidate value is found it is stored for later use in the procedure.

If the search left was successful but the data point found in an existing marker, that value is not stored and the search left continues because existing markers are to be avoided. Once the search left is completed, the search right is performed in the same manner. If two candidates have been found for the marker, one to the left and one to the right of the original marker position, the closest one to the original position in frequency is chosen. If only one candidate was found, that position is chosen as the position for the marker.

If no candidates have been found, then the program checks to see if the current marker position is greater than the desired position. If it is, a minimum search is performed to find the lowest thing on the screen because that will be the closest in amplitude to the desired value. Likewise, if the current marker amplitude is not less than the desired amplitude, a peak search will be performed, because everything on the screen now is below the desired amplitude. The marker will then be placed on the highest point on the display.

Once the marker position is located, the marker is written to the display, and the next sweep begins. This search is done every end of sweep while the function is enabled. FIG. 6 illustrates the results of a marker amplitude operation, with a marker 602 being placed at the specified level of −40 dBm on the skirt of a signal trace 604 on the display.

Figure 7:
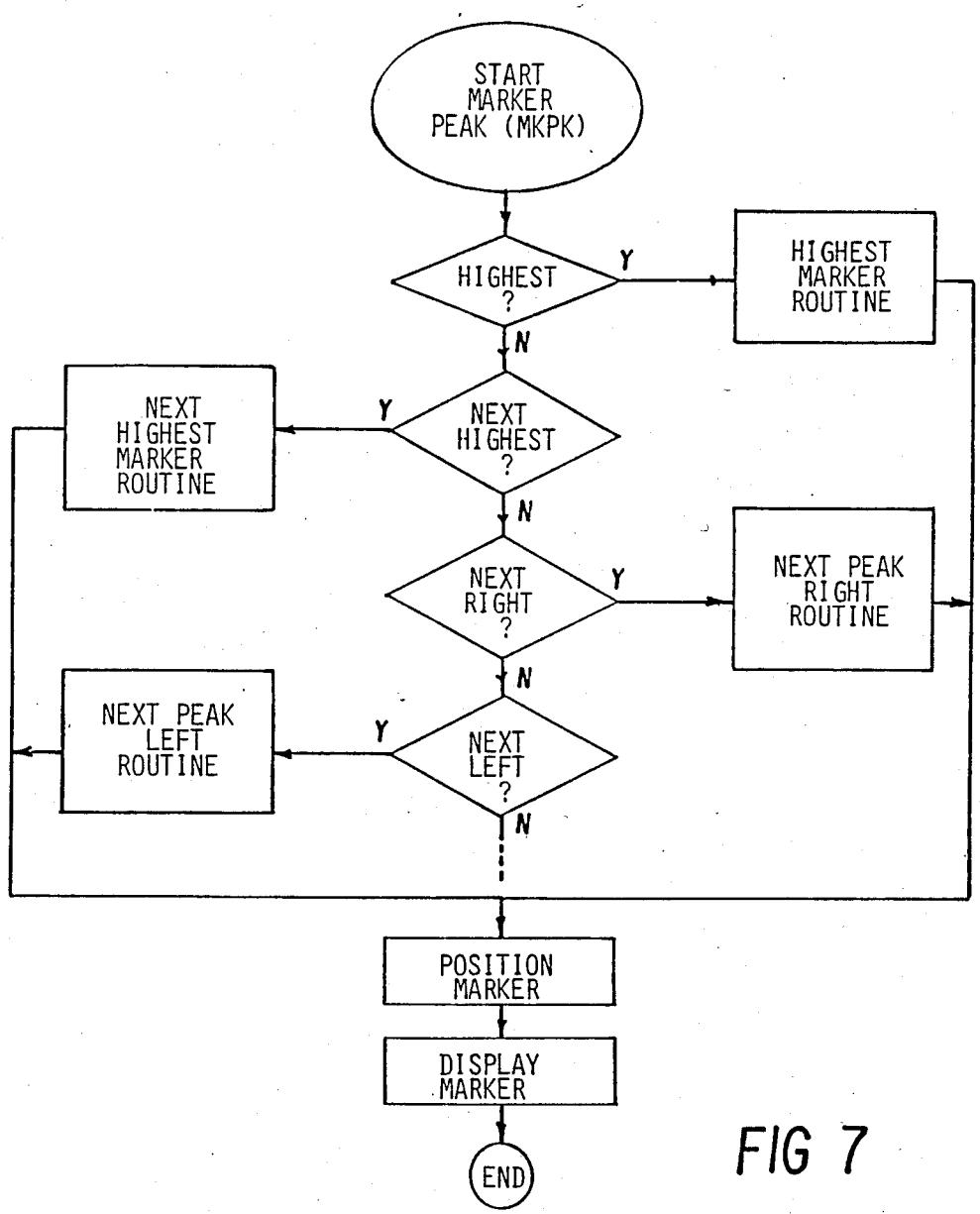
FIG. 7 is an overall flow diagram illustrating the operation of several marker peak functions.

FIGS. 7, 8A-8B and 9 illustrate a marker function that identifies the next peak on the display to either the right or the left of the current marker position. To perform this function there are basically two routines, one of which calls the other one. The first routine is called marker peak (MKPK), and it determines which kind of a peak search is to be done. It begins on line 71 of Appendix I. As shown in FIG. 7 peak searches are possible for the highest peak and the next highest peak, which will not be further discussed here, and for the next peak to the right or the left, which are described below.

When the desired routine is specified by the user, the program fetches the proper trace data and places it into buffer to be searched on and then branches to the appropriate search routine. When the next right or next left functions are specified, the first routine calls the second routine and passes the appropriate parameters to it to tell it which direction to search. After the new position for the marker has been found, the marker is written to the display.

Figure 8A:
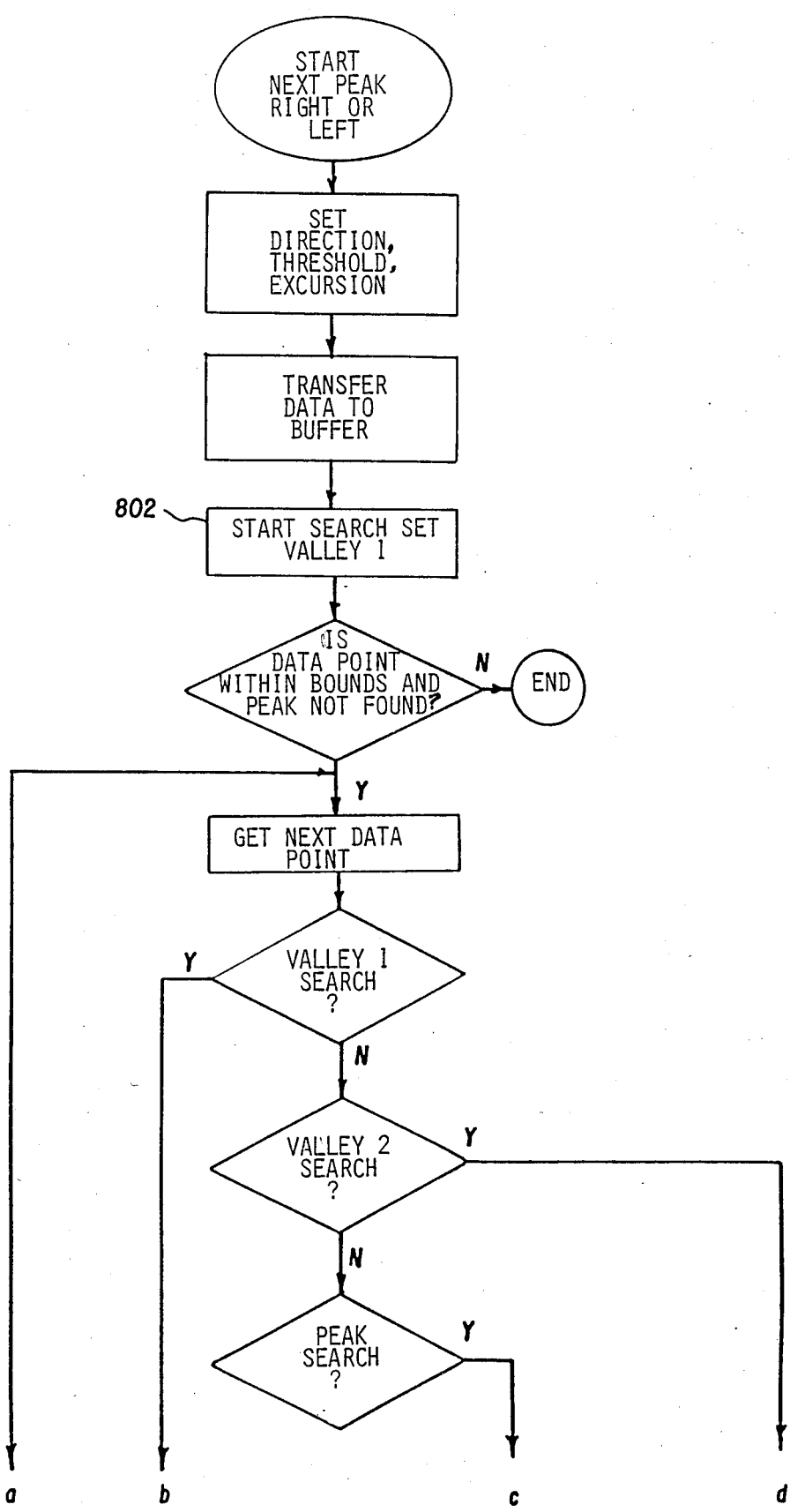
FIGS. 8A–8B show flow diagrams of a function for placing a marker on the next peak to the right or left of the current marker position.
Figure 8B:
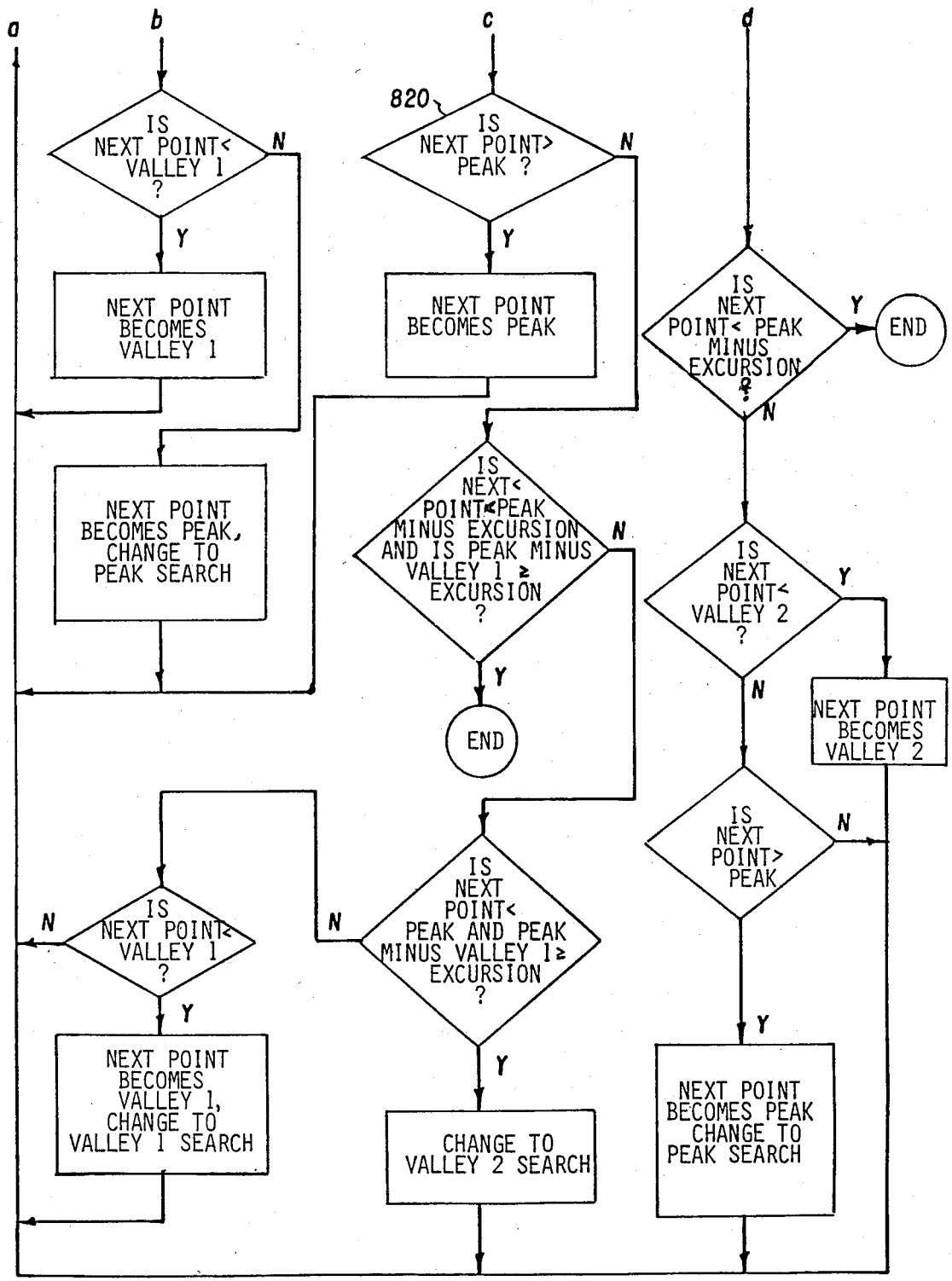

The next peak routine, shown in FIGS. 8A-8B and listed in Appendix I starting at line 34, uses a number of parameters; these include the starting position for the search, the direction of the search, the length of the array being searched, the threshold above which or below which data points are to be ignored and an excursion parameter that describes the height of a peak with respect to the surrounding data. For example, a peak could be specified as a signal in the data array that is at least 6 dB higher than the data on either side of the peak, making 6 dB the excursion for that measurement. These parameters are user specified so the user can decide what size peaks to look for and where to look for them.

Once the initial values have been set, the search is started in the indicated direction. The goal of the search is to find a data point that is higher than points on either side of it by at least the amount of the excursion. For the purposes of the search, there are three variables that are used to determine when a peak has been found: PEAK, the current highest value found in the search; VALLEY1 the lowest value found on the approach side of PEAK; and VALLEY2, the lowest value found on the far side of PEAK.

The search commences with the VALLEY1 search routine which looks for a low point or valley between the starting point and the peak that is to be found. The first value that is taken out of the data buffer is then saved as the first VALLEY1 value in block 802. Next a check is made to ensure that the data point is within the bounds of the parameters set. At the same time a check is made to see if a peak has been found, for if it has, the procedure is finished and the marker can be placed on the display at that data point location. Then the next data point is fetched from the buffer, and it likewise is tested to see if it is within bounds.

Since the instrument is still in the VALLEY1 search mode, it next checks to see if the data point is less than the currently stored VALLEY1 point. If it is, that point becomes the VALLEY1 point because it is lower, indicating a descending slope in the direction of search. If, on the other hand, the point is higher than the current VALLEY1 point, then the data point is stored as the peak value, and the instrument changes to the PEAK search mode. Following that, the next data point is fetched.

Thus, for each data point, a check is first made to make sure that it is within bounds and then a three way determination is made to see which of the three search modes the instrument is in: VALLEY1, VALLEY2 or PEAK. Then further testing of the data is done depending on which search mode is being used.

Once the instrument is in the PEAK search mode, each new data point will be stored as PEAK so long as it is greater than the currently stored value of PEAK. When a data point is found that is less than PEAK, then the instrument checks the see if the difference between VALLEY1 and PEAK is greater than the excursion parameter. If that is the case, then the instrument changes to the VALLEY2 search mode, since the current PEAK value has passed one of the tests for being a peak.

In order to qualify as a peak to be marked on the display, the difference between PEAK and VALLEY2 must also be greater than the excursion parameter. If that is the case with the first data point after the peak is found, then the search is finished. If not, then successive data points need to be tested by the VALLEY2 search. Once a point is found that is low enough, the search is finished, and the marker can be placed on the display. If a data point is found that is greater than PEAK before the VALLEY2 condition is met, the instrument again changes to the PEAK search mode.

When the instrument is in PEAK mode, the next data point may be less than PEAK minus the excursion parameter, thus failing to satisfy the first condition for a true peak. As can be seen from the blocks in FIG. 8B following block 820, the instrument will change back to the VALLEY1 search mode until a new peak candidate is found. This portion of the routine allows the instrument to avoid labeling small bumps or saw teeth on the side of a trace as a peak if the height of the bump does not exceed the excursion parameter.

As mentioned above, once a data point is found that satisfies the search conditions of PEAK minus VALLEY1 and PEAK minus VALLEY2 both being greater than the excursion parameter, then the data point stored as PEAK is the desired point, and a marker can be placed at that point on the display.

Figure 9:
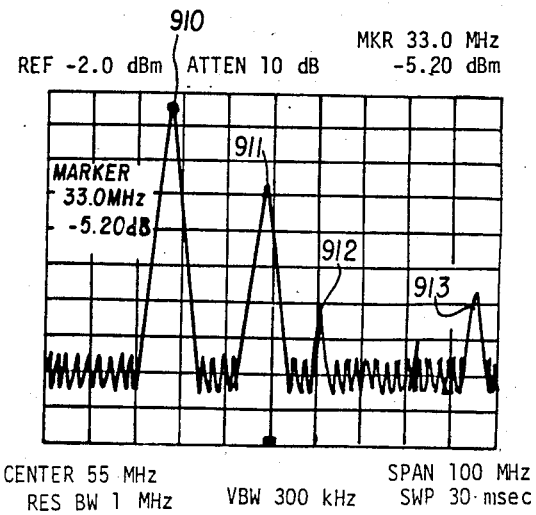
FIG. 9 illustrates the operation of the function of FIGS. 8A–8B.

FIG. 9 illustrates the operation of the next peak right function. The marker starts out on peak 910. When the next peak right function is performed, the marker will be moved to peak 911, the next peak to the right of peak 910. It can be seen that if the next peak right function is performed again, the marker will be on peak 912, whereas if the next peak function in the prior patent were used, the marker would be on peak 913 instead.

It should be noted that, while the amplitude marker feature and the next peak right and left features have been disclosed in connection with a spectrum analyzer, they could be used in other swept frequency instruments such as network analyzers. Furthermore, the next peak right and left features could be adapted to locate valleys or minimum points for use in network analyzers.

The following Appendices I and II give the program instructions for performing the functions described above and illustrated in the Figures. Most of the programs listed in Appendix II are ones that are called by the programs in Appendix I while they are running. These programs are written in the ALGOL language, and can be compiled to run on any appropriate processor. Appendix III is a list of the integrated circuit components used in the controller assembly shown in FIGS. 1A-1F and 2A-2E.

APPENDIX I

```
1   M68KL,L,P,"MRKRS"
2     BEGIN
3
4   EXTERNAL ARRAY NEWSTATE[0:1],MSTATE[0:38],MKBLK,TBUF,TRCD[0:1];
5   INTEGER CONSTANT MKRMODE:=30,MRKR:=28,MKRLVL:=29,AMKR:=26,AMLVL:=27,
6     LEVLIN:=15,THRESH:=16,FSTIM:=38;
7   INTEGER TABLE MKRDSP.L:=2050,2055,2155,2160;
8   EXTERNAL INTEGER MKPX,MKACT;
9   PROCEDURE AFILL(A,LENGTH,VAL); VALUE LENGTH,VAL;
10    ARRAY A[*]; INTEGER LENGTH,VAL; EXTERNAL;
11  PROCEDURE LOADTRC(TADR,TLEN,BUF); VALUE TADR,TLEN; INTEGER TADR,TLEN;
12    ARRAY BUF[*]; EXTERNAL;
13  BYTE PROCEDURE TR662(A); VALUE A; DOUBLE A; EXTERNAL;
14  DOUBLE PROCEDURE TRCADRS(TRC,LEN); VALUE TRC; ALPHA TRC; INTEGER LEN;
15      EXTERNAL;
16  DOUBLE PROCEDURE TRCSETUP(TRC,LEN); VALUE TRC; ALPHA TRC; INTEGER LEN;
17      EXTERNAL;
18  PROCEDURE UPDATEMKR; EXTERNAL.L;
19  BOOLEAN PROCEDURE MKREL; EXTERNAL.L;
20  INTEGER SUBROUTINE MKRTRC; EXTERNAL.L;
21
22  BYTE SUBROUTINE MKATST; ENTRY;
23    MKATST:=((RIGHT(MSTATE[MKRMODE],8) AND 15)/5)=2;
24
25  PROCEDURE MKRSAVE; ENTRY;
26    IF MSTATE[MKRMODE]<>0 THEN BEGIN
27      INTEGER POINTER MKPTR;
28      STPNTR(MKPTR,ADRS(MKBLK[3*(RIGHT(MSTATE[MKRMODE],12) AND 3)]));
29      MKPTR:=MSTATE[MKRMODE];
30      MKPTR[1]:=MSTATE[MRKR];
31      IF NOT MKATST THEN MKPTR[2]:=MSTATE[MKRLVL];
32    END;
33
34  INTEGER PROCEDURE NXTPK(STRT,XINC,BUF,LEN,THR,XCR);
35    VALUE STRT,XINC,LEN,THR,XCR;
36    INTEGER STRT,XINC,LEN,THR,XCR; ARRAY BUF[*];
37    BEGIN INTEGER POINTER TRC=REGISTER 11;
38      INTEGER CONSTANT V1SRCH:=0,PKSRCH:=1,V2SRCH:=2,FOUND:=-1;
39      INTEGER NPY=REGISTER 7,NPX,V1Y=REGISTER 6,PKY=REGISTER 5,PKX,
40        V2Y=REGISTER 4,MODE;
41      DOUBLE TADR=REGISTER 11;
42      PKX:=STRT;
43      V1Y:=V2Y:=PKY:=NPY:=IF BUF[STRT]<THR THEN THR ELSE BUF[STRT];
44      MODE:=V1SRCH;
45      NPX:=STRT+XINC;
46      WHILE NPX>=0 AND NPX<LEN AND MODE>=0 DO BEGIN
47        NPY:=BUF[NPX];
48        IF NPY<THR THEN NPY:=THR;
49        CASE MODE OF BEGIN
50  &v1src& IF NPY<V1Y THEN V1Y:=NPY
51          ELSE IF NPY>PKY OR NPY>V1Y+XCR THEN BEGIN
52            PKX:=NPX;
53            PKY:=NPY;
54            MODE:=PKSRCH;
55          END;
56  &pksrc& IF NPY>PKY THEN BEGIN PKY:=NPY; PKX:=NPX; END
57          ELSE IF NPY<PKY-XCR AND V1Y<PKY-XCR THEN MODE:=FOUND
58          ELSE IF NPY<PKY AND V1Y<PKY-XCR THEN
```

```
59              BEGIN V2Y:=NPY; MODE:=V2SRCH; END
60          ELSE IF NPY<V1Y THEN BEGIN V1Y:=NPY; MODE:=V1SRCH; END;
61 &v2src& IF NPY<PKY-XCR THEN MODE:=FOUND
62          ELSE IF NPY<V2Y THEN V2Y:=NPY
63          ELSE IF NPY>PKY THEN
64              BEGIN PKY:=NPY; PKX:=NPX; MODE:=PKSRCH; END;
65       END;
66       NPX:=NPX+XINC;
67     END;
68     NXTPK:=IF MODE=FOUND THEN PKX ELSE STRT;
69   END;
70
71 PROCEDURE MKPK(C); VALUE C; ALPHA C; ENTRY;
72   BEGIN BYTE POINTER BP=C;
73     INTEGER MRKRX,MRKRY,NEW,NP,PKTHR,PKXCR,CNT,I;
74     IF BP[1]='H THEN LDKEY(@113)
75     ELSE BEGIN
76       LOADTRC(MKRTRC,1001,TBUF);
77       MRKRX:=MSTATE[MRKR]-1;
78       MRKRY:=MSTATE[MKRLVL];
79       PKTHR:=MSTATE[THRESH];
80       PKXCR:=AMPADC("MKPX");
81       IF BP[2]='H THEN BEGIN
82         NEW:=0; CNT:=0;
83         DO BEGIN NP:=NEW; NEW:=NXTPK(NP,1,TBUF,1001,PKTHR,PKXCR);
84           IF NP<>NEW  AND NEW<>MRKRX THEN BEGIN
85             I:=CNT;
86             WHILE I>0 AND TBUF[TRCD[I-1]]<TBUF[NEW] DO BEGIN
87               TRCD[I]:=TRCD[I-1];
88               I:=I-1;
89             END;
90             TRCD[I]:=NEW;
91             CNT:=CNT+1;
92           END;
93         END UNTIL NEW=NP;
94         I:=0;
95         WHILE I<CNT AND (TBUF[TRCD[I]]>MRKRY OR TBUF[TRCD[I]]=MRKRY AND
96           TRCD[I]<=MRKRX) DO I:=I+1;
97         IF I<CNT THEN MRKRX:=TRCD[I];
98         MSTATE[MRKR]:=MRKRX+1;
99       END ELSE
100        MSTATE[MRKR]:=NXTPK(MRKRX,
101          IF BP[2]='L THEN -1 ELSE 1,
102          TBUF,1001,PKTHR,PKXCR)+1;
103      UPDATEMKR;
104    END;
105  END;
106
107 PROCEDURE MKASRCH; ENTRY;
108   IF MKATST THEN BEGIN
109     INTEGER I=REGISTER 7,J=REGISTER 6,MRKRY=REGISTER 5,SLVL=REGISTER 4;
110     DOUBLE PBUF=REGISTER 9,RBUF=REGISTER 10;
111     INTEGER POINTER PBUFP=PBUF,RBUFP=RBUF;
112     ARRAY AVOID[0:3];
113     INTEGER MRKRX,ILAST,JLAST;
114     BYTE SRCH;
115
116     SUBROUTINE SLFT;
117       BEGIN
118         PBUF:=PBUF+2;
```

```
119         SRCH:=FALSE;
120 LOOPN1: ASSEMBLE(CMP  -(PBUF),SLVL;  DBNE I,LOOPN1);
121         IF < THEN BEGIN
122           I:=I-1;
123           IF I>0 THEN
124 LOOP1:  ASSEMBLE( CMP  -(PBUF),SLVL;  DBGE I,LOOP1;  SGE  SRCH)
125         END ELSE IF > THEN BEGIN
126           I:=I-1;
127           IF I>0 THEN
128 LOOP2:  ASSEMBLE( CMP  -(PBUF),SLVL;  DBLE I,LOOP2;  SLE  SRCH);
129         END;
130         IF SRCH AND ABS(PBUFP-SLVL)>ABS(PBUFP[1]-SLVL) THEN
131           PBUF:=PBUF+2;
132         I:=IF SRCH THEN ARIGHT(PBUF-ADRS(TBUF),1) ELSE -1;
133       END;
134
135    SUBROUTINE SRGT;
136      BEGIN
137        SRCH:=FALSE;
138        J:=1000-J;
139 LOOPN2: ASSEMBLE(CMP  (RBUF)+,SLVL;  DBNE J,LOOPN2);
140        IF < THEN BEGIN
141          J:=J-1;
142          IF J>0 THEN
143 LOOP3:  ASSEMBLE( CMP   (RBUF)+,SLVL;  DBGE J,LOOP3;  SGE  SRCH)
144        END ELSE IF > THEN BEGIN
145          J:=J-1;
146          IF J>0 THEN
147 LOOP4:  ASSEMBLE( CMP   (RBUF)+,SLVL;  DBLE J,LOOP4;  SLE  SRCH);
148        END;
149        RBUF:=RBUF-2;
150        IF SRCH AND ABS(RBUFP[-1]-SLVL)<ABS(RBUFP-SLVL) THEN
151          RBUF:=RBUF-2;
152        J:=IF SRCH THEN ARIGHT(RBUF-ADRS(TBUF),1) ELSE 1001;
153      END;
154
155    SUBROUTINE SETAVOID;
156      IF I>0 THEN BEGIN
157        I:=I-1;
158        IF (RIGHT(MKBLK[I*3],8) AND 15)/5=2 THEN AVOID[I]:=MKBLK[I*3+1]-1;
159      END;
160
161      AFILL(AVOID,4,-1);
162      ILAST:=-1;
163      JLAST:=1001;
164      I:=(RIGHT(MSTATE[MKRMODE],12) AND 3);
165      IF I<>MKACT-1 THEN BEGIN
166         WHILE I>0 DO SETAVOID;
167         I:=MKACT;
168         SETAVOID;
169      END;
170      LOADTRC(MKRTRC,1001,TBUF);
171      SLVL:=MKBLK[3*(RIGHT(MSTATE[MKRMODE],12) AND 3)+2];
172      I:=J:=MRKRX:=MSTATE[MKR]-1;
173      PBUF:=RBUF:=ADRS(TBUF[I]);
174      MRKRY:=RBUFP;
175      IF MRKRY<>SLVL THEN BEGIN SLFT; SRGT; END;
176      WHILE I>0 AND (I=AVOID OR I=AVOID[1] OR I=AVOID[2] OR I=AVOID[3])
177        AND I<>ILAST DO
178          BEGIN ILAST:=I; SLFT; IF I<0 THEN I:=ILAST; END;
```

```
179       WHILE J<=1000 AND(J=AVOID OR J=AVOID[1] OR J=AVOID[2] OR J=AVOID[3])
180        AND J<>JLAST
181         DO BEGIN JLAST:=J; SRGT; IF J>1000 THEN J:=JLAST; END;
182       IF I>=0 AND J<=1000 THEN
183         MRKRX:=(IF (MRKRX-I<J-MRKRX OR
184           (J=AVOID OR J=AVOID[1] OR J=AVOID[2] OR J=AVOID[3])) AND NOT
185           (I=AVOID OR I=AVOID[1] OR I=AVOID[2] OR I=AVOID[3])THEN I ELSE J)
186       ELSE IF I>=0 THEN MRKRX:=I
187       ELSE IF J<=1000 THEN MRKRX:=J
188       ELSE BEGIN DOUBLE PBUF=REGISTER 9,PKPIT=REGISTER 10;
189          ASSEMBLE( LEA   TBUF,PBUF);
190          I:=1000;
191          IF SLVL>MRKRY THEN BEGIN
192             LABEL LOOPG,NOPEAK;
193             J:=-32767;
194  LOOPG:   ASSEMBLE( CMP (PBUF)+,J; BGE  NOPEAK;  LEA -2(PBUF),PKPIT;
195                     MOVE (PKPIT),J;
196  NOPEAK:             DBRA I,LOOPG);
197          END ELSE BEGIN
198             LABEL LOOPM,NOPIT;
199             J:=32767;
200  LOOPM:   ASSEMBLE( CMP (PBUF)+,J; BLE  NOPIT;  LEA -2(PBUF),PKPIT;
201                     MOVE (PKPIT),J;
202  NOPIT:              DBRA I,LOOPM);
203          END;
204          ASSEMBLE( LEA  TBUF,PBUF; SUB  PBUF,PKPIT);
205          MRKRX:=RIGHT(PKPIT,1);
206       END;
207       MSTATE[MRKR]:=MRKRX+1;
208       MSTATE[MKRLVL]:=TBUF[MRKRX];
209    END;
210
211  SUBROUTINE MKRSPOT; EXTERNAL.L;
212  SUBROUTINE MKRAD; EXTERNAL.L;
213  PROCEDURE NEWMRKRS; ENTRY;
214    BEGIN INTEGER I,J;
215       INTEGER POINTER MKPTR;
216       SAVE(MSTATE[MKRMODE],MSTATE[MRKR],MSTATE[MKRLVL]);
217       MKRSAVE;
218       FOR I:=1 TO 4 DO BEGIN
219          STPNTR(MKPTR,ADRS(MKBLK[(I-1)*3]));
220          J:=(RIGHT(MKPTR,8) AND 15)/5;
221          IF MKACT<>I AND MKPTR<>0 AND (J=0 OR J=2) THEN BEGIN
222             MSTATE[MKRMODE]:=MKPTR;
223             MSTATE[MRKR]:=MKPTR[1];
224             MSTATE[MKRLVL]:=MKPTR[2];
225             IF J=2 THEN MKASRCH
226             ELSE IF J=0 THEN BEGIN
227                MKRAD;
228                MSTATE[MKRLVL]:=ARIGHT(LEFT(READ(ADRS(DSTRD):NOT FLAG),5),5);
229             END;
230             MKRSPOT;
231             MKRSAVE;
232          END;
233       END;
234       RESTORE(MSTATE[MKRMODE],MSTATE[MRKR],MSTATE[MKRLVL]);
235    END newmrkrs;
236
237  END$
238  #EOF#
```

APPENDIX II

```
1   M68KL,P,"PAT 2"
2     BEGIN
3   GLOBAL INTEGER ARRAY MSTATE[0:38];
4   BCDL LTEMP1,LTEMP2,LTEMP,XL,MANT,EEVAL;
5   GLOBAL BCDL FSTEP=MSTATE[22],MKRFRQ,AZSPAN,CSIGNL,
6       CFREQ=MSTATE,SPAN=MSTATE[4],AMF=MSTATE[31],
7       FOFSET=MSTATE[18],EPVAL;
8   GLOBAL INTEGER XFLAG,DSPSIZ,PREFIX,EPEXP,
9       BLEDS=MSTATE[8],TLEDS=MSTATE[9],RFAT=MSTATE[10],
10      SINDEX=MSTATE[36],STIM=MSTATE[37],
11      FSTIM=MSTATE[38],STRIG=MSTATE[14],
12      RLVL=MSTATE[11],RVBW=MSTATE[12],VIDCON=MSTATE[13],
13      MRKR=MSTATE[28],MKRMODE=MSTATE[30],AMLVL=MSTATE[27],
14      AMKR=MSTATE[26],MKRLVL=MSTATE[29],KFLAG=MSTATE[35],
15      ROFSET=MSTATE[17],THRESH=MSTATE[16],LEVLIN=MSTATE[15],
16      DAC1,DAC2,DAC4,ALIM,ACNT,SRCEID,EFLAG,BITS1=EFLAG,
17      UFLAG,IF1,IF2,GIN1,GIN2,SRQEN,RPGPTR,RPGSWP,
18      SCANSL,SATN,PLOCK,LKMSK,HPBC,CTIM,CTBASE;
19  GLOBAL BYTE MKRMD=MKRMODE+1,MKRTYP=MKRMODE;
20
21  PROCEDURE SETRCAD(A); VALUE A; INTEGER A; ENTRY;
22          & set trace address in 85662&
23      IF A<>0 THEN
24      WRITE(ADRS(DSAD):NOT FLAG,LEFT(A-1,10)+1);
25
26  PROCEDURE LOADTRC(TADR,TLEN,BUF); VALUE TADR,TLEN; INTEGER TADR,TLEN;
27    ARRAY BUF[*]; ENTRY;
28    BEGIN
29         INTEGER CNT=REGISTER 5,DATA=REGISTER 6;
30         DOUBLE PTR=REGISTER 9;
31         SETRCAD(TADR);
32         PTR:=ADRS(BUF);
33         CNT:=TLEN-1;
34  LOOP: READ(ADRS(DSTRD):NOT FLAG,DATA);
35         ASSEMBLE(LSL #5,DATA; ASR #5,DATA; MOVE DATA,(PTR)+;
36            DBRA CNT,LOOP);
37    END loadtrc;
38
39  BOOLEAN SUBROUTINE MKREL; ENTRY; MKREL:=MKRMD MOD 3=1;
40
41  BOOLEAN SUBROUTINE MKRROK;
42      MKRROK:=NOT(FSTIM<0 OR TEST(TLEDS,@44,@44));
43
44  INTEGER TABLE MKRDSP:=2050,2055,2155,2160;
45
46  INTEGER SUBROUTINE MKRTRC; ENTRY;
47    MKRTRC:= CASE RIGHT(MKRTYP,6) OF (
48         IF TBIT(VIDCON,11) AND TBIT(TLEDS,1) OR
49         NOT TEST(TLEDS,0,@201) THEN 1 ELSE 2,1,2,4);
50
51  SUBROUTINE MKRAD; ENTRY;
52      IF MKRROK THEN
53         WRITE(ADRS(DSAD):NOT FLAG,MRKR+1024*(MKRTRC-1))
54         ELSE BEGIN SAVE(MRKR,MKRMODE,BLEDS); KEY(@114);
55            RESTORE(MRKR,MKRMODE,BLEDS);
56            END MKRAD;
57
58  SUBROUTINE MKRSPOT; ENTRY;
```

```
59    BEGIN
60      DSWRITE(MKRDSP[RIGHT(MKRTYP,4) AND 3],@2202);
61      DSITM(LIMIT(MRKR-4,1000));
62      DSITM(LIMIT(MKRLVL-4,1015)+2052);
63    END;
64
65 INTEGER SUBROUTINE MKRDOUT; ENTRY;
66    MKRDOUT:=(MKRTYP AND 15) MOD 5;
67
68 PROCEDURE MKRON; ENTRY;
69      BEGIN LABEL EXIT;
70      INTEGER I,KK;
71      IF MRKR=1023 THEN BEGIN MRKR:=501; MKRFRQ:=CFREQ; END;
72      IF NOT TBIT(BLEDS,13) THEN BEGIN
73        CASE MKRDOUT OF BEGIN
74          BEGIN
75            MKRFRQ:=CFREQ+DRIGHT(ROUND((MRKR-501)*SPAN,12),3);
76            IF MKREL THEN MKRFRQ:=MKRFRQ-AMF; END;
77          MKRFRQ:=DRIGHT(EXPSIX(SINDEX+24),3)*
78            (MRKR+MKREL*(AMKR-1)-1);
79          MKRFRQ:=IF MKREL AND MRKR=AMKR THEN 1000000000 ELSE
80            1@6/REAL(DRIGHT(EXPSIX(SINDEX+24),3)*
81            (MRKR+MKREL*(AMKR-1)-1));
82          MKRFRQ:=5@2*(MRKR-1+MKREL*(AMKR-1))/
83            REAL(DRIGHT(EXPSIX(SINDEX+24),3));
84          BEGIN  MKRFRQ:=CFREQ+DRIGHT(ROUND((MRKR-501)*SPAN,12),3);
85            MKRFRQ:=1@12/REAL(MKRFRQ)-(IF MKREL THEN 1@12/REAL
86              (CFREQ+DRIGHT(ROUND((AMKR-501)*SPAN,12),3)) ELSE 0);
87          END;
88        END;
89      END;
90      IF MRKROK THEN MKRAD
91        ELSE BEGIN SAVE(MRKR,MKRMODE,BLEDS); KEY(@114);
92          RESTORE(MRKR,MKRMODE,BLEDS);
93          IF KEYCODE#@113 OR K#5 THEN GO TO EXIT; END MKRAD;
94      IF (MKRTYP AND 15)/5=0 THEN BEGIN
95        IF TBIT(BLEDS,3) THEN BEGIN SAVE(MRKR);
96          MRKR:=LIMIT(MRKR-17,968)+1;
97          MKRLVL:=0; MKRAD;
98          REPEAT 32 DO BEGIN
99              READ(ADRS(DSTRD):NOT FLAG,KK);
100             MKRLVL:=MKRLVL+ARIGHT(LEFT(KK,5),5);
101           END;
102         MKRLVL:=LIMIT(ARIGHT(MKRLVL,5),1023); RESTORE(MRKR);
103       END ELSE BEGIN
104         MKRLVL:=ARIGHT(LEFT(READ(ADRS(DSTRD):NOT FLAG),5),5); END;
105       IF TBIT(BLEDS,5) AND MKRLVL<(THRESH AND @177774) THEN
106         MKRLVL:=THRESH AND @177774;
107     END;
108     MKRSPOT;
109     IF K#3 THEN BEGIN
110       READ(ADRS(DSRDSCAN):NOT FLAG,I); READ(ADRS(DSTRD):NOT FLAG,I);
111       WRITE(ADRS(DSLDMRKR):NOT FLAG,(IF (I AND @7777)<MRKR AND MKIS
112         THEN MRKR ELSE 1001)+
113         (IF NOT TBIT(KFLAG,2) THEN 0 ELSE 3072));
114       BLKAD(17); READ(ADRS(DSTRD):NOT FLAG,I);
115       IF (I AND @1777)=146 THEN BEGIN
116         NBLK(MKRMD); DSITM(146); NBLK(17); END; END;
117     IF NOT TBIT(BLEDS,13) THEN BEGIN BLKAD(MKRMD);
118       DSITM(IF TEST(IF1,@100000,@160000) AND
```

```
119             MKRLVL<100 THEN @21 ELSE 0); END;
120       IF NOT TBIT(BLEDS,13) OR NOT TBIT(UFLAG,6) AND K#2
121          OR SCANSL=0 THEN RJUST(MKRMD,1040);
122       RJUST(17,1024);
123 EXIT: END MRKR ON;
124
125 PROCEDURE DOEOS; ENTRY;
126 &eos& BEGIN INTEGER I,J,K; BCDL LTEMP1;
127
128       IF MKRMD#0 AND NOT MKIS THEN
129            BEGIN MKASRCH; MKRON; MKRACT; END;
130       NEWMRKRS;
131       IF TBIT(IOFLAG,14) THEN BEGIN
132            DOSOFTKEY(-1);    & execute ONEOS command string &
133       END;
134       IF TBIT(TLEDS,10) AND NOT (TBIT(EFLAG,12) OR
135         TBIT(XFLAG,9) OR TBIT(KFLAG,2) AND ACNT<ALIM)
136         THEN BEGIN UNCAL;
137           STRIG:=@20000; END ELSE BEGIN
138           IF NOT SREQ THEN BEGIN XFLAG:=XFLAG OR 6; GO TO RESET; END;
139            IF TBIT(XFLAG,5) THEN YIGSHFT;
140            TRIGR; END; END SCAN;
141
142 PROCEDURE DOMRKR; ENTRY;
143 & mrkr & IF MKRMD#0 THEN BEGIN
144         MKASRCH;
145         MKRON; XFLAG:=SBIT(XFLAG,3);
146         IF TBIT(BLEDS,13) THEN MRKRCNTR;
147         IF (EFLAG AND 3)#0 THEN BEGIN
148           CSIGNL:=COUNTIF(EFLAG AND 3);
149           IF RPGPTR=18 THEN BEGIN PREFIX:=35+(EFLAG AND 3);
150              DSPITEM; ABLK; END; END ELSE MKRACT;
151         XFLAG:=RBIT(XFLAG,3);
152         IF TBIT(XFLAG,13) AND NOT TBIT(XFLAG,9)
153           THEN STRIG:=@20000;
154         IF MKPAUSE<>0 THEN SETDLY(MKPAUSE*1000.0);
155         IF TBIT(EFLAG,12) THEN BEGIN HPBC:=SBIT(HPBC,13);
156           IF TSCHK="TS" THEN BEGIN
157             TSCHK:=0;
158             AUXCA:=RHDF;
159           END;
160           IOFLAG:=RBIT(IOFLAG,12);
161           EFLAG:=RBIT(EFLAG,12); END;
162         IF MRKR=1001 OR MKPAUSE=0 AND NOT TBIT(TLEDS,10)
163           AND TBIT(XFLAG,13) THEN DOEOS;
164       END MRKR;
165
166
167    INTEGER CONSTANT NEWLEN:=25;
168    GLOBAL INTEGER CONSTANT NEWLENG:=NEWLEN;
169    DOUBLE TABLE SYMTABADRS:=%FF4006;
170    GLOBAL INTEGER POINTER SYMTAB=SYMTABADRS;
171    GLOBAL INTEGER ARRAY NEWSTATE[0:NEWLEN];
172    GLOBAL REAL MKPAUSE=NEWSTATE[19];
173    GLOBAL INTEGER MKACT=NEWSTATE,
174       MKBLK=NEWSTATE[1],          & through NEWSTATE[9] &
175       MKFC=NEWSTATE[10],
176       MKNOISE=NEWSTATE[18],
177       MKPX=NEWSTATE[21],
178       MKTRACK=NEWSTATE[22],
```

```
179         AMB=NEWSTATE[11],
180         ANNOT=NEWSTATE[12],
181         DLE=NEWSTATE[13],
182         GRAT=NEWSTATE[14],
183         MDS=NEWSTATE[15],
184         TDF=NEWSTATE[16],
185         THE=NEWSTATE[17];
186     ARRAY NEWSAVE[1:7,0:NEWLEN];
187
188     EXTERNAL INTEGER ARRAY MSTATE[0:38];
189     INTEGER CONSTANT MKRMODE:=30,MRKR:=28,MKRLVL:=29,AMKR:=26,AMLVL:=27;
190     EXTERNAL INTEGER SYMLEN;
191
192     INTEGER CONSTANT SFTNEST:=10,SFTLIM:=12+5*SFTNEST;
193     GLOBAL INTEGER ARRAY SFTBLK[0:SFTLIM];
194
195 GLOBAL INTEGER TABLE MNEM.L:="MB","WR",%0280,%00CD,%3004
196     ,"MB","RD",%0283,%00CA,%3004
197     ,"MW","RB",%0280,%00C7,%3004
198     ,"MR","DB",%0196,%00C5,%3004
199     ,"MW","R ",%0280,%00C2,%3003
200     ,"MR","D ",%0196,%00C0,%3003
201     ,"BW","R ",%0280,%00BD,%3003
202     ,"BR","D ",%0196,%00BB,%3003
203     ,"SN","GL","S ",%4000,49,%1005,
204         "S2",0,0,2
205     ,"CO","NT","S ",%4000,59,%1005,
206         "S1",0,0,2
207     ,"RC","LS",%4000,68,%1004,
208         "RC",0,0,2
209     ,"SA","VE","S ",%4000,78,%1005,
210         "SV",0,0,2
211     ,"ML",%4000,87,%1002,
212         "KS"," ",0,0,3
213     ,"RO","FF","SE","T ",%4000,99,%1007,
214         "KS","Z ",0,0,3
215     ,"FO","FF","SE","T ",%4000,111,%1007,
216         "KS","V ",0,0,3
217     ,"VB","O ",%0180,%00B9,%3003
218     ,"SR","Q ",%0180,%00B7,%3003
219     ,"RQ","S ",%0180,%00B5,%3003
220     ,"ID",%0083,%00B4,%3002
221     ,"ME","M ",%0098,%00B3,%3003
222     ,"TM",%0180,%00B1,%3002
223     ,"DE","T ",%0180,%00AF,%3003
224     ,"MD","U ",%0083,%00AE,%3003
225     ,"CL","RA","VG",%0080,%00AD,%3006
226     ,"TE","XT",%0180,%00AB,%3004
227     ,"OP",%0083,%00AA,%3002
228     ,"RE","V ",%0083,%00A9,%3003
229     ,"ER","R ",%0083,%00A8,%3003
230     ,"DO","NE",%0083,%00A7,%3004
231     ,"CT","M ",%0280,%00A4,%3003
232     ,"CT","A ",%0280,%00A1,%3003
233     ,"AU","NI","TS",%0180,%009F,%3006
234     ,"TH","E ",%1DC1,%0011,%4003
235     ,"TD","F ",%1CD4,%0010,%4003
236     ,"MD","S ",%1BD4,%000F,%4003
237     ,"GR","AT",%1AC1,%000E,%4004
238     ,"DL","E ",%19C1,%000D,%4003
```

```
239     ,"AN","NO","T ",%18C1,%000C,%4005
240     ,"KE","YE","XC",%0180,%009D,%3006
241     ,"FU","NC","DE","F ",%0280,%009A,%3007
242     ,"KE","YD","EF",%0280,%0097,%3006
243     ,"DI","SP","OS","E ",%0180,%0095,%3007
244     ,"TR","DE","F ",%0280,%0092,%3005
245     ,"VA","RD","EF",%0280,%008F,%3006
246     ,"US","TA","TE",%0CC0,%003F,%4006
247     ,"EP",%0BC0,%003F,%4002
248     ,"UN","TI","L ",%06C0,%003F,%4005
249     ,"RE","PE","AT",%05C0,%003F,%4006
250     ,"EN","DI","F ",%04C0,%003F,%4005
251     ,"EL","SE",%03C0,%003F,%4004
252     ,"TH","EN",%02C0,%003F,%4004
253     ,"IF",%01C0,%003F,%4002
254     ,"DS","PL","Y ",%0280,%008C,%3005
255     ,"ON","SW","P ",%0180,%008A,%3005
256     ,"ON","EO","S ",%0180,%0088,%3005
257     ,"PL","OT",%0480,%0083,%3004
258     ,"RM","S ",%0199,%0081,%3003
259     ,"SU","MS","QR",%0198,%007F,%3006
260     ,"SU","M ",%0198,%007D,%3003
261     ,"ST","DE","V ",%0199,%007B,%3005
262     ,"VA","RI","AN","CE",%0199,%0079,%3008
263     ,"ME","AN",%0196,%0077,%3004
264     ,"PW","RB","W ",%0299,%0074,%3005
265     ,"PE","AK","S ",%0396,%0070,%3005
266     ,"PD","F ",%0280,%006D,%3003
267     ,"PD","A ",%0380,%0069,%3003
268     ,"CO","MP","RE","SS",%0380,%0065,%3008
269     ,"TR","GR","PH",%0580,%005F,%3006
270     ,"TW","ND","OW",%0280,%005C,%3006
271     ,"FF","TC","NV",%0280,%0059,%3006
272     ,"FF","TM","PY",%0380,%0055,%3006
273     ,"FF","TK","NL",%0280,%0052,%3006
274     ,"FF","T ",%0380,%004E,%3003
275     ,"XC","H ",%0280,%004B,%3003
276     ,"SQ","R ",%0280,%0048,%3003
277     ,"SU","B ",%0380,%0044,%3003
278     ,"SM","OO","TH",%0280,%0041,%3006
279     ,"MX","M ",%0380,%003D,%3003
280     ,"MP","Y ",%0380,%0039,%3003
281     ,"MI","N ",%0380,%0035,%3003
282     ,"EX","P ",%4000,475,%1003,
283       "TR","CE","XP","   ",0,0,7
284     ,"LO","G ",%4000,487,%1003,
285       "TR","CL","OG","   ",0,0,7
286     ,"TR","CE","XP",%0380,%0031,%3006
287     ,"TR","CL","OG",%0380,%002D,%3006
288     ,"DI","V ",%0380,%0029,%3003
289     ,"CO","NC","AT",%0380,%0025,%3006
290     ,"AV","G ",%0380,%0021,%3003
291     ,"AD","D ",%0380,%001D,%3003
292     ,"MO","V ",%0280,%001A,%3003
293     ,"VI","EW",%0180,%0018,%3004
294     ,"TR","ST","AT",%0083,%0017,%3006
295     ,"TR","PR","ST",%4000,575,%1006,
296       "A1","B4","C1","KS","kE","MT","OL","O ","DI",
297     "SP","OS","E ","ON","EO","S;","DI","SP","OS","E ",
298     "ON","SW","P;","DI","SP","OS","E ","TR","MA","TH",
```

```
299    "; ",0,0,59
300    ,"TR","MA","TH",%0180,%0015,%3006
301    ,"TR","DS","P ",%0280,%0012,%3005
302    ,"MX","MH",%0180,%0010,%3004
303    ,"CL","RW",%0180,%000E,%3004
304    ,"BL","AN","K ",%0180,%000C,%3005
305    ,"VA","VG",%4000,613,%1004,
306     "KS","G ",0,0,3
307    ,"BX","C ",%4000,623,%1003,
308     "KS","i ",0,0,3
309    ,"BT","C ",%4000,633,%1003,
310     "KS","1 ",0,0,3
311    ,"BM","L ",%4000,643,%1003,
312     "BL","; ",0,0,3
313    ,"AX","B ",%4000,653,%1003,
314     "EX","; ",0,0,3
315    ,"AP","B ",%4000,669,%1003,
316     "AD","D ","TR","A,","TR","A,","TR","B;",0,0,16
317    ,"AM","BP","L ",%4000,694,%1005,
318     "SU","B ","TR","D,","TR","A,","TR","B;","AD",
319    "D ","TR","A,","TR","D,","DL","; ",0,0,31
320    ,"AM","B ",%17C1,%000B,%4003
321    ,"MK","CO","NT",%0080,%000B,%3006
322    ,"MK","MI","N ",%0080,%000A,%3005
323    ,"MK","OF","F ",%0180,%0008,%3005
324    ,"MK","P ",%16D6,%FFFD,%4003
325    ,"MK","F ",%15DE,%FFFE,%4003
326    ,"MK","A ",%14D0,%FFFF,%4003
327    ,"MK","TR","AC","K ",%13C1,%0016,%4007
328    ,"MK","TY","PE",%0180,%0006,%3006
329    ,"MK","TR","AC","E ",%0180,%0004,%3007
330    ,"MK","ST","OP",%4000,763,%1006,
331     "KS","u ",0,0,3
332    ,"MK","SP",%4000,773,%1004,
333     "KS","O ",0,0,3
334    ,"MK","SS",%4000,783,%1004,
335     "E3","; ",0,0,3
336    ,"MK","RL",%4000,793,%1004,
337     "E4","; ",0,0,3
338    ,"MK","RE","AD",%0180,%0002,%3006
339    ,"MK","PX",%11D0,%0015,%4004
340    ,"MK","PK",%0180,%0000,%3004
341    ,"MK","PA","US","E ",%0FD9,%0013,%4007
342    ,"MK","NO","IS","E ",%12C1,%0012,%4007
343    ,"MK","N ",%4000,832,%1003,
344     "M2",0,0,2
345    ,"MK","FC","R ",%4000,843,%1005,
346     "KS","= ",0,0,3
347    ,"MK","FC",%0EC1,%000A,%4004
348    ,"MK","D ",%4000,857,%1003,
349     "M3",0,0,2
350    ,"MK","CF",%4000,867,%1004,
351     "E2","; ",0,0,3
352    ,"MK","AC","T ",%0DD6,%0000,%4005
353    ,"TR","D ",%0AC0,%003F,%4003
354    ,"TR","C ",%09C0,%003F,%4003
355    ,"TR","B ",%08C0,%003F,%4003
356    ,"TR","A ",%07C0,%003F,%4003
357    ;
358    GLOBAL INTEGER CONSTANT MLEN:=893;
```

```
359  INTEGER CONSTANT HASHCODE:=13;
360  GLOBAL INTEGER TABLE HASHPTR.L:=0,6,15,23,29,36,40,
361    48,59,70,83,92,100,108;
362  GLOBAL INTEGER TABLE OLDCMDS.L:="UP","T2","D3","DM",
363    "CV","A4","T3","SV","M1","LG","HD","GZ","EE","DN",
364    "DA","UR","T4","TA","SW","OT","M2","DB","C1","US",
365    "TB","S1","M3","MZ","C2","S2","M4","MA","L0","KS",
366    "I1","DD","PA","I2","DR","CA","UV","O1","MC","LL",
367    "GR","FA","B1","AT","TS","R1","O2","OL","FB","E1",
368    "EX","EK","DT","B2","BL","VB","SP","SC","R2","RL",
369    "PD","O3","LN","IB","E2","B3","TH","R3","PR","O4",
370    "OA","MS","MF","LB","IP","E3","EM","CR","B4","R4",
371    "PS","MT","HZ","E4","DW","CS","CF","A1","T0","SS",
372    "RB","KZ","FS","D1","CT","A2","T1","ST","RC","PU",
373    "MV","D2","DL","A3";
374  GLOBAL BYTE TABLE KEYTAB.L:=85,119,163,47,66,101,
375    120,0,76,1,42,47,2,84,3,124,121,4,166,5,6,47,99,
376    32,7,116,8,35,102,117,9,10,109,115,60,11,12,62,
377    13,68,32,8,14,122,15,16,103,17,2,6,11,18,19,75,
378    105,29,20,104,108,21,22,35,4,23,27,14,114,24,78,
379    106,25,7,26,9,27,38,28,29,160,81,5,65,107,0,165,
380    30,32,82,31,69,32,97,111,33,34,38,44,161,67,98,
381    118,35,36,28,38,162,37,100;
382  GLOBAL BYTE TABLE IMEDBITS.L:=127,173,229,58,167,
383    75,231,102,183,202,223,154,159,11;
384  GLOBAL DOUBLE TABLE SFLGVAL.L:=%18040028,%06120071,
385    %1B07005B,%28050019,%00230012,%00250015,%1207004D,
386    %00230013,%1207004F,%12070050,%11330011,%0003000F,
387    %29050021,%00250014,%0001007D,%290500A4,%09070058,
388    %04130049,%00230016,%0A070059,%00020024,%02070047,
389    %08070057,%0510005A,%0003000C,%0F100070,%29050022,
390    %0025001E,%12270010,%29030018,%0001007E,%2905001A,
391    %07070056,%0B07004A,%01070046,%03090048,%19040029,
392    %0E10006E;
393  GLOBAL BYTE TABLE PARMTYPE.L:=0,3,1,3,2,3,3,3,4,3,5,6,7,3,8,3
394    ,9,3,10,3,1,11,3,12,13,3,14,3,3,15,3,3,3,16,3,3,25,17,3,3,3
395    ,18,3,3,3,19,3,3,25,20,3,3,25,21,3,3,3,22,3,3,3,23,3,3,3,24
396    ,3,22,25,3,3,3,26,3,3,27,3,3,28,3,3,3,29,3,3,30,3,3,25,31,3
397    ,3,32,3,3,33,22,22,22,22,3,34,3,3,3,35,3,3,16,36,3,3,37,3,3
398    ,3,38,3,25,39,3,40,3,41,3,42,3,43,3,44,3,45,25,25,25,25,46,3
399    ,47,3,48,29,16,49,3,29,50,3,22,51,3,52,22,3,53,3,3,54,22,55
400    ,3,56,3,22,57,3,25,58,59,60,61,62,3,63,64,65,3,66,3,67,68,69
401    ,22,70,22,71,22,72,22,73,22,22,74,24,75,24,22,76,24,77,24,22
402    ,78,24,22,79,24,3;
403  EXTERNAL LABEL MKPK,MKREAD,MKTRACE,MKTYPE,MKOFF,MKMIN
404    ,MKCONT,BLANK,CLRW,MXMH,TRDSP,TRMATH,TRSTAT,VIEW,MOV
405    ,ADD,AVG,CONCAT,DIV,TRCLOG,TRCEXP,MIN,MPY,MXM,SMOOTH
406    ,SUB,SQR,XCH,FFT,FFTKNL,FFTMPY,FFTCNV,TWNDOW,TRGRPH
407    ,COMPRESS,PDA,PDF,PEAKS,PWRBW,MEAN,VARIANCE,STDEV
408    ,SUM,SUMSQR,RMS,PLOT,ONEOS,ONSWP,DSPLY,VARDEF,TRDEF
409    ,DISPOSE,KEYDEF,FUNCDEF,KEYEXC,AUNITS,CTA,CTM,DONE
410    ,ERR,REV,OP,TEXT,CLRAVG,MDU,DET,TM,MEM,ID,RQS,SRQ
411    ,VBO,BRD,BWR,MRD,MWR,MRDB,MWRB,MBRD,MBWR;
412  GLOBAL DOUBLE TABLE PRCADRS.L:=ADRS(MKPK),ADRS(MKREAD)
413    ,ADRS(MKTRACE),ADRS(MKTYPE),ADRS(MKOFF),ADRS(MKMIN)
414    ,ADRS(MKCONT),ADRS(BLANK),ADRS(CLRW),ADRS(MXMH),ADRS(TRDSP)
415    ,ADRS(TRMATH),ADRS(TRSTAT),ADRS(VIEW),ADRS(MOV),ADRS(ADD)
416    ,ADRS(AVG),ADRS(CONCAT),ADRS(DIV),ADRS(TRCLOG),ADRS(TRCEXP)
417    ,ADRS(MIN),ADRS(MPY),ADRS(MXM),ADRS(SMOOTH),ADRS(SUB)
418    ,ADRS(SQR),ADRS(XCH),ADRS(FFT),ADRS(FFTKNL),ADRS(FFTMPY)
```

```
419        ,ADRS(FFTCNV),ADRS(TWNDOW),ADRS(TRGRPH),ADRS(COMPRESS)
420        ,ADRS(PDA),ADRS(PDF),ADRS(PEAKS),ADRS(PWRBW),ADRS(MEAN)
421        ,ADRS(VARIANCE),ADRS(STDEV),ADRS(SUM),ADRS(SUMSQR)
422        ,ADRS(RMS),ADRS(PLOT),ADRS(ONEOS),ADRS(ONSWP),ADRS(DSPLY)
423        ,ADRS(VARDEF),ADRS(TRDEF),ADRS(DISPOSE),ADRS(KEYDEF)
424        ,ADRS(FUNCDEF),ADRS(KEYEXC),ADRS(AUNITS),ADRS(CTA)
425        ,ADRS(CTM),ADRS(DONE),ADRS(ERR),ADRS(REV),ADRS(OP)
426        ,ADRS(TEXT),ADRS(CLRAVG),ADRS(MDU),ADRS(DET),ADRS(TM)
427        ,ADRS(MEM),ADRS(ID),ADRS(RQS),ADRS(SRQ),ADRS(VBO)
428        ,ADRS(BRD),ADRS(BWR),ADRS(MRD),ADRS(MWR),ADRS(MRDB)
429        ,ADRS(MWRB),ADRS(MBRD),ADRS(MBWR);
430   GLOBAL BYTE TABLE PFXSCALE.L:=0,7,7,9,19,16,18,7,
431        7,7,7,7,0,5,16,16,0,16,7,7,7,7,7,7,4,4,5,5,0,16,
432        0,7,5,0,16,7,7,7,7,9,5,5,16,5,7;
433
434   INTEGER PROCEDURE SYMPTR(SYMTAB,PTR); VALUE PTR; INTEGER PTR;
435        ARRAY SYMTAB[*]; ENTRY;
436        SYMPTR:=PTR-2-RIGHT((SYMTAB[PTR] AND %FFF)+1,1);
437
438   INTEGER PROCEDURE NEWCMD(FLG,SYMTAB,SYMLEN,NAME);
439        VALUE FLG,SYMLEN; INTEGER FLG,SYMLEN; ARRAY SYMTAB,NAME[*];
440        ENTRY;
441     IF SYMLEN>0 THEN BEGIN LABEL FLOOP,AGAIN,LENCHK,SCOMP,SLOOP,EXIT;
442        INTEGER WORDCNT=REGISTER 2,WORDINIT=REGISTER 3,FLGBITS=REGISTER 1;
443        DOUBLE CBUF=REGISTER 10,SBUF=REGISTER 11;
444        WORDINIT:=RIGHT((FLG AND %FFF)-1,1);
445        FLGBITS:=FLG;
446        ASSEMBLE(
447           MOVE.L  SYMTAB,SBUF;
448           MOVE    SYMLEN,R6;
449           ADD     R6,R6;
450           MOVE.L  =H1A001A,R5;       & flag bits for symbol compare &
451   FLOOP: MOVE    0(R11,R6),R0;      & fetch length &
452           ROL     #4,R0;             & isolate flag bits &
453           BTST    R0,R5;             & check for symbol flag &
454           BNE     LENCHK;            & skip if symbol flag &
455           LSR     #4,R0;             & isolate symbol length &
456   AGAIN: ADDQ    #7,R0;             & compute offset to next symbol &
457           AND     =HFFE,R0;          & mask off garbage &
458           SUB     R0,R6;             & decrement pointer &
459           BGT     FLOOP;             & go try next symbol &
460           MOVE    #-1,R0;            & set result to not present &
461           BRA     EXIT;
462   LENCHK: LSR    #4,R0;             & isolate symbol length &
463           CMP     R0,R1;             & check length &
464           BNE     AGAIN;             & compare string if = &
465   SCOMP: MOVE    R3,R2;             & initialize symbol cntr &
466           MOVE.L  NAME,R10;          & initialize cmdbuf ptr &
467           LEA     -6(R11,R6),R9;     & initialize symtab pointer &
468           SUB     R2,R9;             & do it twice (byte addressing) &
469           SUB     R2,R9;             & now it points to begin of symbol &
470   SLOOP: CMPM    (R9)+,(R10)+;      & compare words &
471           DBNE    R2,SLOOP;
472           BNE     AGAIN;             & go try again &
473           MOVE    R6,R0;             & compute symtab indx &
474           LSR     #1,R0);
475   EXIT: END ELSE NEWCMD:=-1;
476
477   INTEGER PROCEDURE OLDCMD(CMD); VALUE CMD; INTEGER CMD;
478        BEGIN INTEGER I,J,K,L;
```

```
479         I:=CMD MOD HASHCODE;
480         J:=HASHPTR[I];
481         K:=HASHPTR[I+1]-J;
482         L:=SEARCH(OLDCMDS[J]=CMD,K);
483         OLDCMD:=IF L<K THEN L+J ELSE -1;
484     END OLDCMD;
485
486 BCDL PROCEDURE PFVAL(CMD); VALUE CMD; INTEGER CMD; ENTRY;
487     BEGIN DOUBLE SVF; INTEGER SFLG=SVF,SVAL=SVF+2,J;
488       IF (J:=OLDCMD(CMD))>=0 AND
489        NOT TBIT(IMEDBITS[RIGHT(J,3)],J AND 7) THEN BEGIN
490         SVF:=SFLGVAL[KEYTAB[J]];
491         PFVAL:=IF NOT TEST(SFLG,2,30) THEN ACTVAL(RIGHT(SFLG,8)) ELSE 0;
492       END ELSE PFVAL:=0;
493     END pfval;
494
495 INTEGER PROCEDURE TVSRCH(SFLG,LENFLG); VALUE SFLG,LENFLG;
496     INTEGER SFLG,LENFLG; ENTRY;
497     BEGIN INTEGER J;
498       J:=SYMLEN;
499       WHILE J>0 AND ((SYMTAB[J] AND %F000)<>LENFLG OR SYMTAB[J-2]<>SFLG)
500         DO J:=SYMPTR(SYMTAB,J)-1;
501       TVSRCH:=J;
502     END tvsrch - trace/variable/softkey search;
503
504 BYTE PROCEDURE TR662(A); VALUE A; DOUBLE A; ENTRY;
505     TR662:=A>0 AND A<=4;
506
507 DOUBLE PROCEDURE TRCADRS(TRC,LEN); VALUE TRC; ALPHA TRC; INTEGER LEN;
508     ENTRY;
509     BEGIN  ARRAY NAME[0:12]; BYTE ARRAY NB[0:1]=NAME;
510       DOUBLE TABLE TADR.L:=1,2,4,ADRS(TRCD);
511       INTEGER SLEN,J,K;
512       SLEN:=LENGTH(TRC);
513       MOVE NB:=TRC;
514       NB[SLEN]:=32;
515       IF SLEN=3 AND NAME="TR" AND NB[2]>='A AND NB[2]<='D THEN BEGIN
516         TRCADRS:=TADR[NB[2]-'A];
517         LEN:=1001;
518       END ELSE IF (J:=NEWCMD(SLEN,SYMTAB,SYMLEN,NAME))>0 AND
519         TEST(SYMTAB[J],%1000,%F000) AND
520         TEST(SYMTAB[J-2],1,-1) AND
521         (K:=TVSRCH(SYMTAB[J-1],%5000))>0 THEN BEGIN
522           LEN:=SYMTAB[K-1];
523           TRCADRS:=ADRS(SYMTAB[SYMPTR(SYMTAB,K)]);
524       END ELSE BEGIN
525           TRCADRS:=0;
526           LEN:=0;
527       END;
528  .  END TRCADRS;
529
530 PROCEDURE DOSTRING(I,SYMTAB); VALUE I; INTEGER I; ARRAY SYMTAB[*];
531     ENTRY;
532     BEGIN DOUBLE SKADRS=SFTBLK[8];
533       IF I>0 THEN BEGIN
534         SFTBLK[12]:=SFTBLK[12]+1;
535         IF SFTBLK[12]<=SFTLIM THEN BEGIN
536           IF SFTBLK[12]>1 THEN
537             MOVE SFTBLK[SFTBLK[12]*5+3]:=SFTBLK[7],+(5);
538           SFTBLK[7]:=SFTBLK[11]:=SYMTAB[I] AND %FFF;   & length of key &
```

```
539        SFTBLK[7]:=SFTBLK[7]+1;
540        SFTBLK[10]:=0;
541        SKADRS:=ADRS(SYMTAB[SYMPTR(SYMTAB,I)]);
542        PARSE(SFTBLK);
543        WHILE SFTBLK[12]>0 AND SFTBLK[10]=SFTBLK[11] DO BEGIN
544           SFTBLK[12]:=SFTBLK[12]-1;
545           IF SFTBLK[12]>0 THEN
546              MOVE SFTBLK[7]:=SFTBLK[SFTBLK[12]*5+8],+(5);
547           END;
548           IF SFTBLK[12]=0 THEN SQUEEZE(TVSRCH(1000,%2000));
549        END ELSE DSMSG(AFB,"SOFTKEY OVERFLOW");
550     END ELSE DSMSG(AFB,"UNDEFINED SOFTKEY: ");
551   END dostring;
552
553 PROCEDURE DOSOFTKEY(N); VALUE N; INTEGER N; ENTRY;
554   BEGIN & search for key &
555     INTEGER K,TSAVE;
556     K:=TVSRCH(N,%2000);
557     IF K>0 THEN BEGIN
558        IF -10<N AND N<0 THEN BEGIN
559           IF CMDLEN<>0 THEN BACKUP(LASTBLK,CMDLEN);
560           CMDLEN:=0;
561           TSAVE:=TLEDS;
562           TLEDS:=RBIT(TLEDS,9);
563        END;
564        DOSTRING(K,SYMTAB);
565        IF TBIT(TSAVE,9) AND -10<N AND N<0 THEN TLEDS:=SBIT(TLEDS,9);
566     END;
567   END dosoftkey;
568
569 PROCEDURE NEWPARM(PARM,FLG); VALUE PARM,FLG; BCDL PARM; INTEGER FLG;
570   BEGIN
571     INTEGER PARMI=PARM;
572     CASE RIGHT(FLG,8)-13 OF BEGIN
573 & mkact &
574     BEGIN
575     INTEGER POINTER MKPTR=REGISTER 9;
576     MKACT:=LIMIT(MKACT-1,3)+1;
577     MKRSAVE;
578     STPNTR(MKPTR,ADRS(NEWSTATE[MKACT*3-2]));
579     MSTATE[MKRMODE]:=
580        TURN(MSTATE[MKRMODE],MKPTR,IF MKREL THEN %FF00 ELSE %FFFF);
581     MSTATE[MRKR]:=MKPTR[1];
582     MSTATE[MKRLVL]:=MKPTR[2];
583     MSTATE[MKRMODE]:=TURN(MSTATE[MKRMODE],LEFT(MKACT-1,12),%3000);
584     IF MSTATE[MRKR]=0 THEN MSTATE[MRKR]:=501;
585     IF TEST(MSTATE[MKRMODE],0,%FF) THEN BEGIN
586        LDKEY('M');
587     END;
588     IF MKATST THEN MKASRCH;
589     UPDATEMKR;
590   END activate marker;
591
592 & mkfc &
593           IF ANALYZER=8568 THEN BEGIN PUT(KEYBLK,@175); LDKEY(MKFC); END;
594
595 & mkpause &    BEGIN PUT(KEYBLK,'s); LDKEY('u'); LDKEY('t'); END;
596
597 & mkpt &       COMMENT - MKPT - NOTHING TO DO;
598
```

```
599  & mkpx &          COMMENT - MKPX - NOTHING TO DO;
600
601  & mknoise &       BEGIN PUT(KEYBLK,'s); LDKEY('L+(MKNOISE AND 1)); END;
602
603  & mktrack &       BEGIN PUT(KEYBLK,@176); LDKEY(MKTRACK); END;
604
605  & mka &           IF MKACT>0 THEN BEGIN INTEGER RL,LG;
606                       LG:=PFVAL("LG");
607                       RL:=PFVAL("RL");
608                       MSTATE[MKRLVL]:=
609                       NEWSTATE[MKACT*3]:=IF MKREL THEN
610                          (IF LG=0 THEN PARMI/10 ELSE PARMI/LG)+MSTATE[AMLVL]
611                       ELSE (IF LG=0 THEN PARMI/10 ELSE
612                          (PARMI-RL)/LG+1000);
613                       IF MKATST THEN MKASRCH;
614                       UPDATEMKR;
615                    END;
616
617  & mkf &
618     BEGIN  ARRAY TBLK[0:12];
619        BCDL LTEMP=TBLK;
620        TBLK[6]:=0;
621        IF ANALYZER=8568 THEN BEGIN
622           LTEMP:=DRIGHT(PARM,2);
623           TBLK[5]:=TBLK[4]:=18;
624        END ELSE BEGIN
625           LTEMP:=PARM;
626           TBLK[4]:=10;
627        END;
628        DOENTRY(TBLK);
629     END;
630
631  & mkp &
632     BEGIN
633        MSTATE[MRKR]:=
634           LIMIT(PARMI+(IF MKREL THEN MSTATE[AMKR] ELSE 0)-1,1000)+1;
635        UPDATEMKR;
636     END;
637
638  & amb &           LDKEY(IF AMB THEN 'f ELSE 'c);
639
640  & annot &         BEGIN PUT(KEYBLK,'s); LDKEY((ANNOT AND 1)+'o); END;
641
642  & dle &           LDKEY((DLE AND 1)+'m);
643
644  & grat &          BEGIN PUT(KEYBLK,'s); LDKEY((GRAT AND 1)+'m); END;
645
646  & mds &           COMMENT - MDS - NOTHING TO DO;
647
648  & tdf &           COMMENT - TDF - NOTHING TO DO;
649
650  & the &           LDKEY((THE AND 1)+'o);
651
652       END of newparm case;
653     END newparm;
654
655  END$
656  #EOF#
```

APPENDIX III

Figure 2:
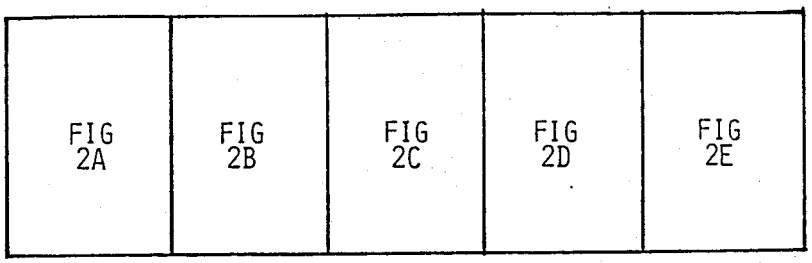
Figure 5:
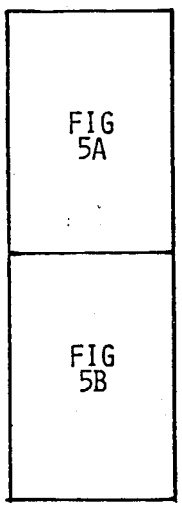
FIG. 5 shows the combination of FIGS. 5A–5C.
Figure 8:
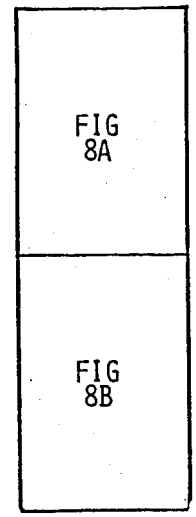
FIG. 8 shows the combination of FIGS. 8A–8C.
Figure 1C:
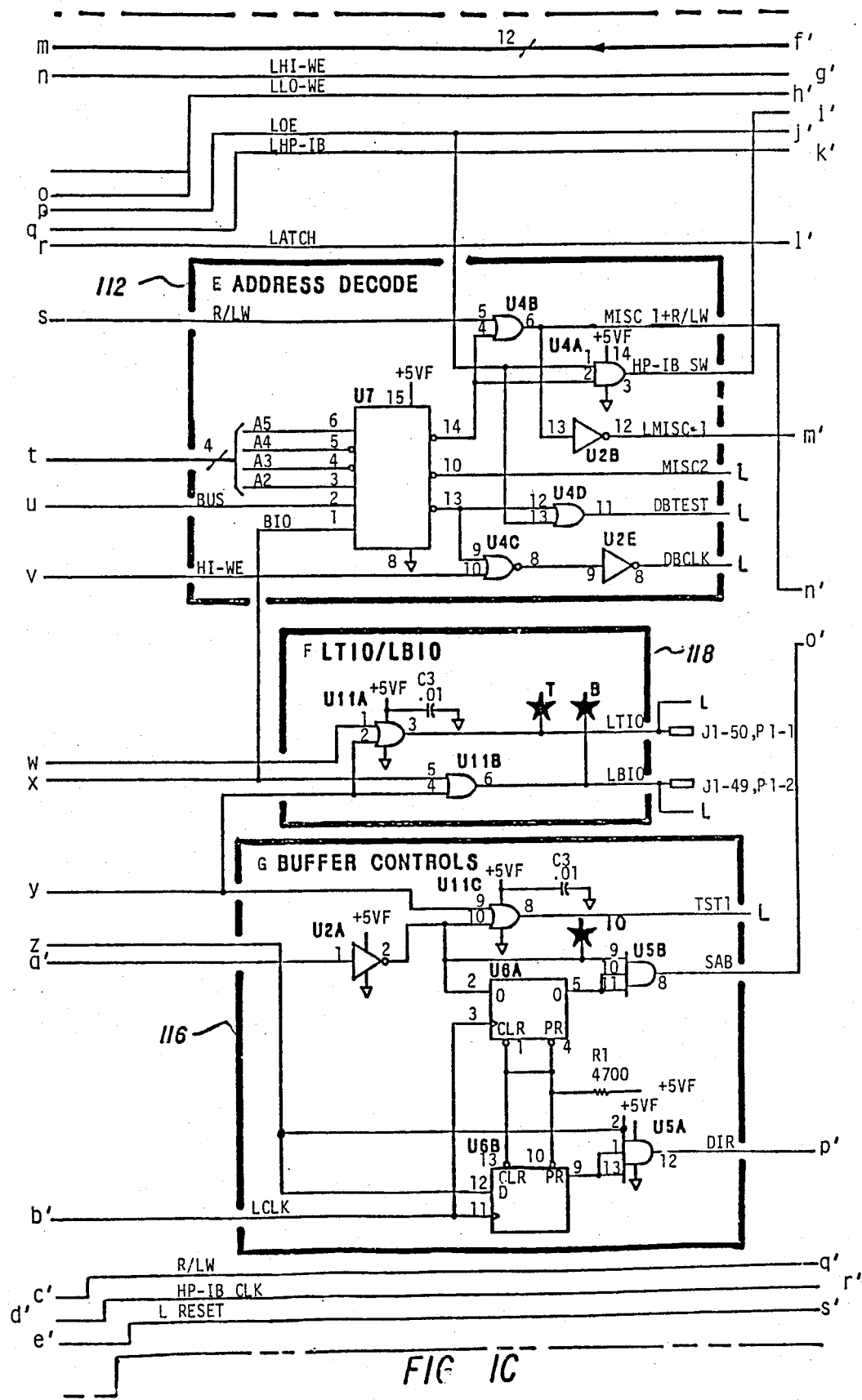
Figure 1D:
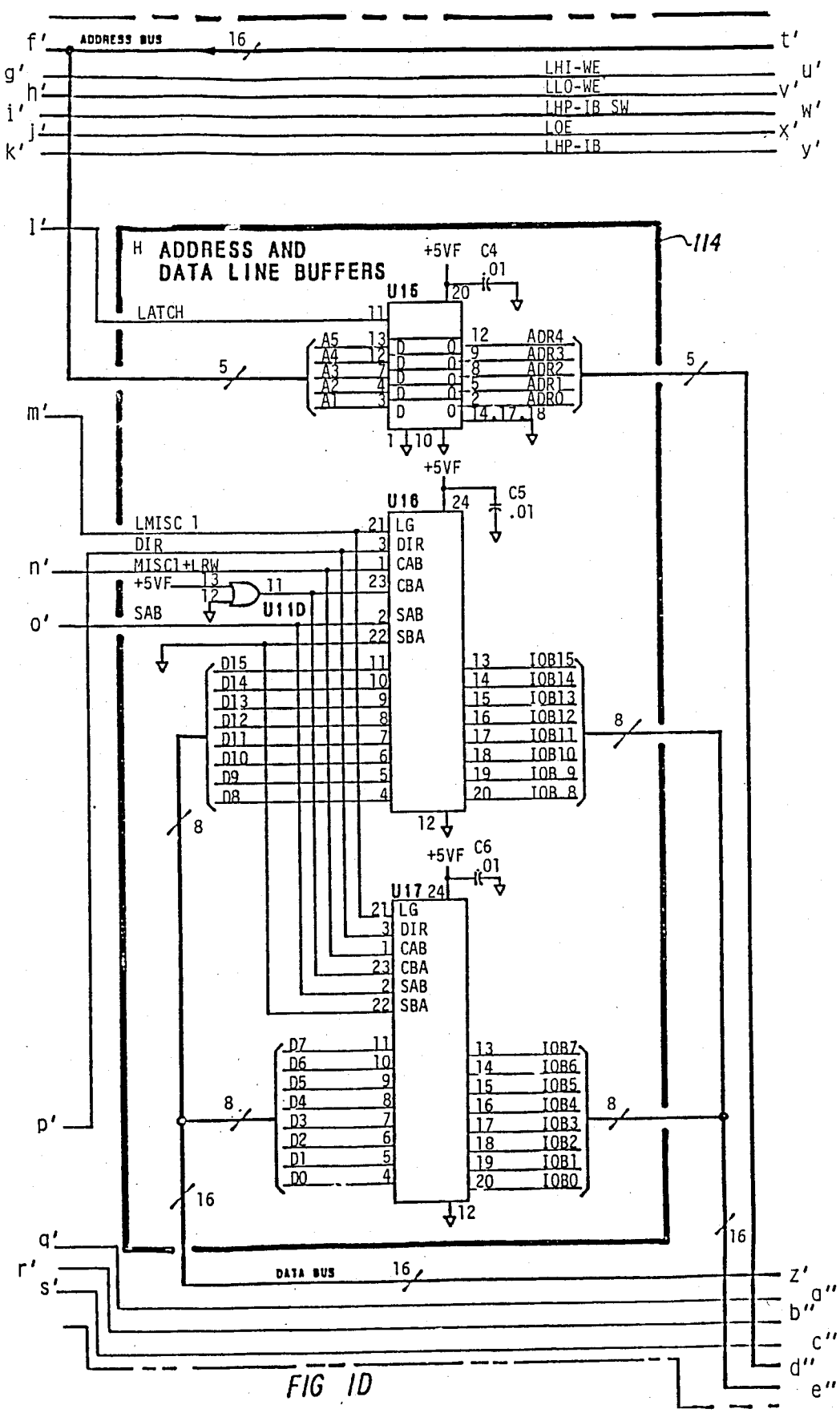
Figure 1F:
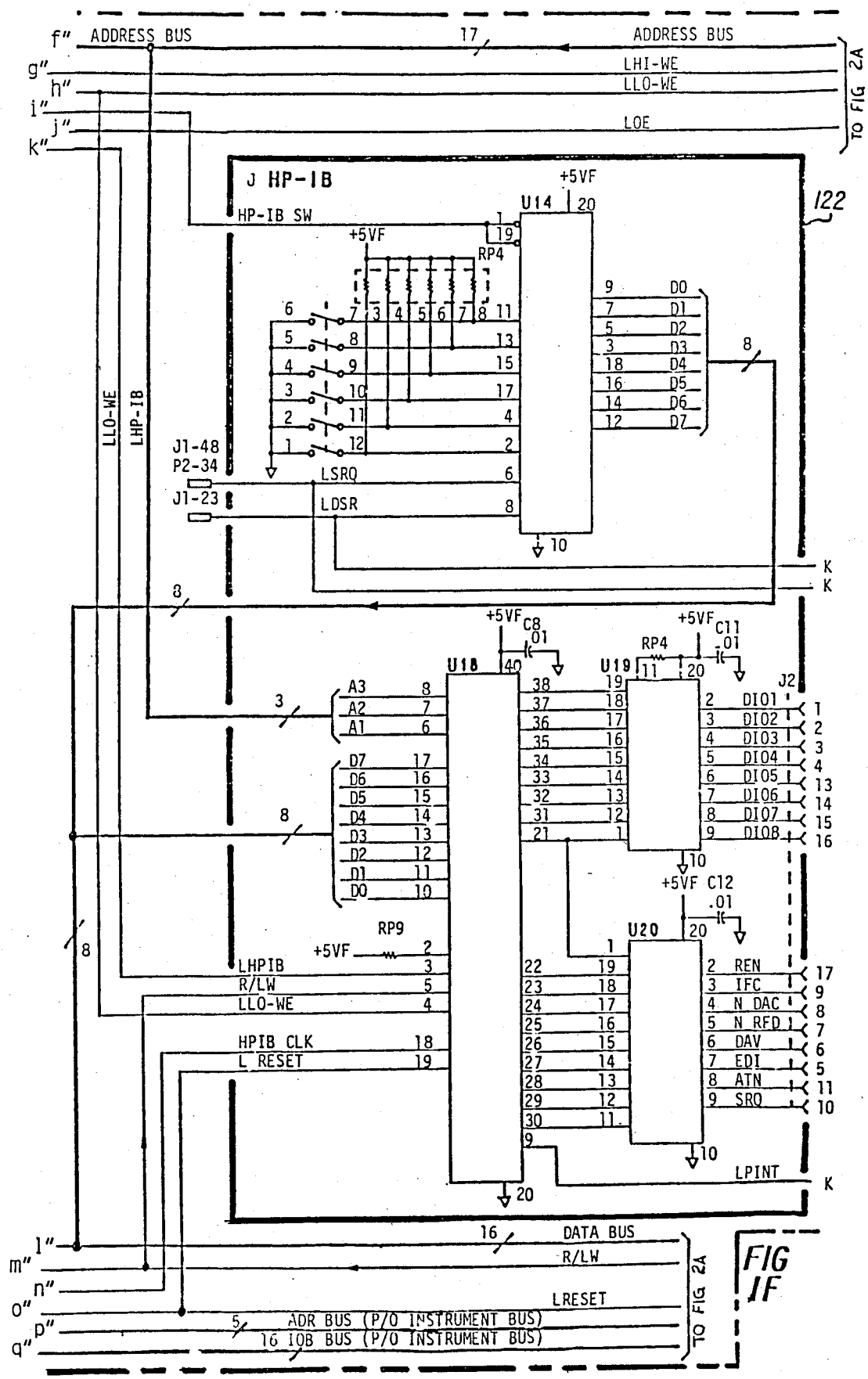
Figure 2B:
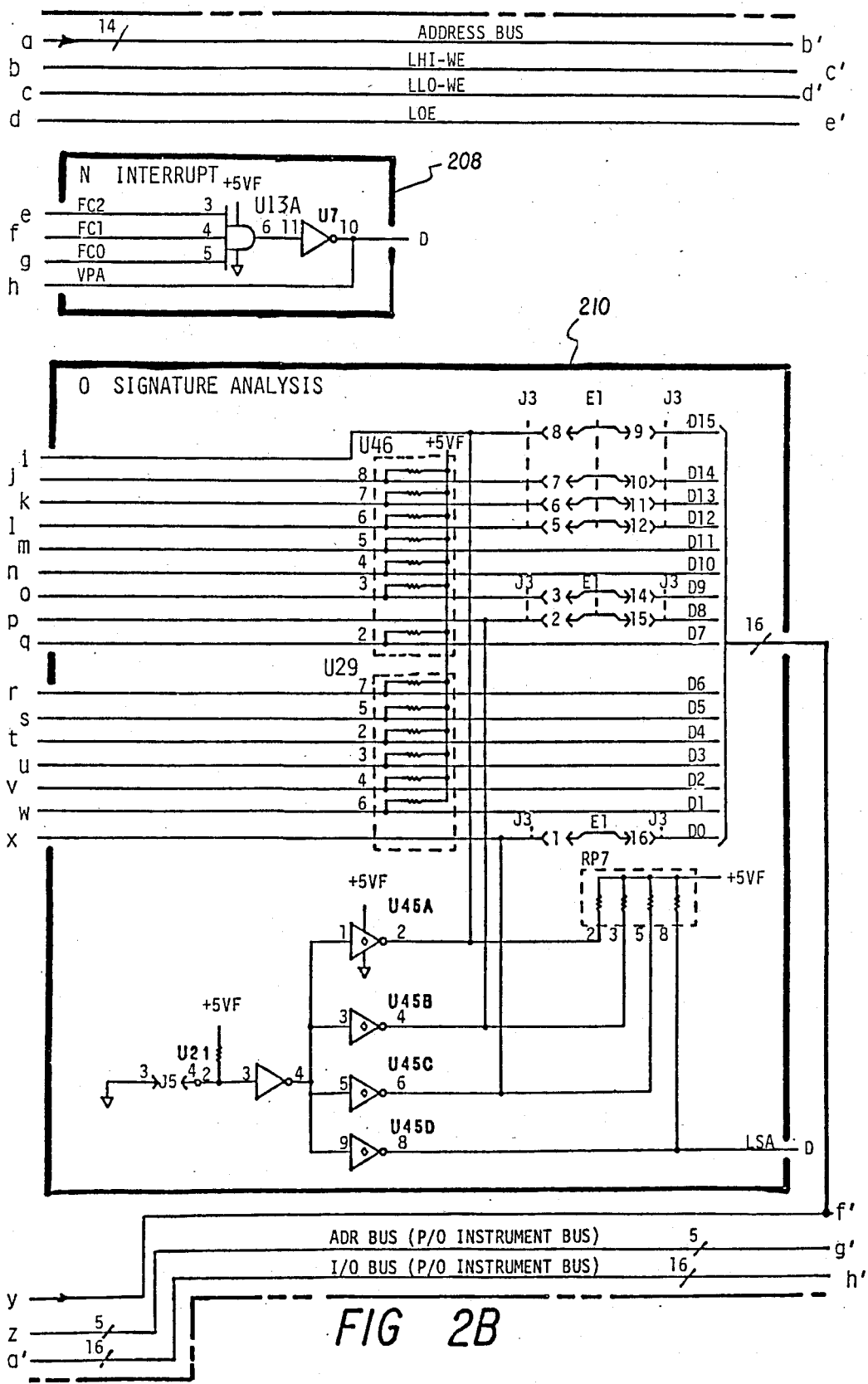
Figure 2C:
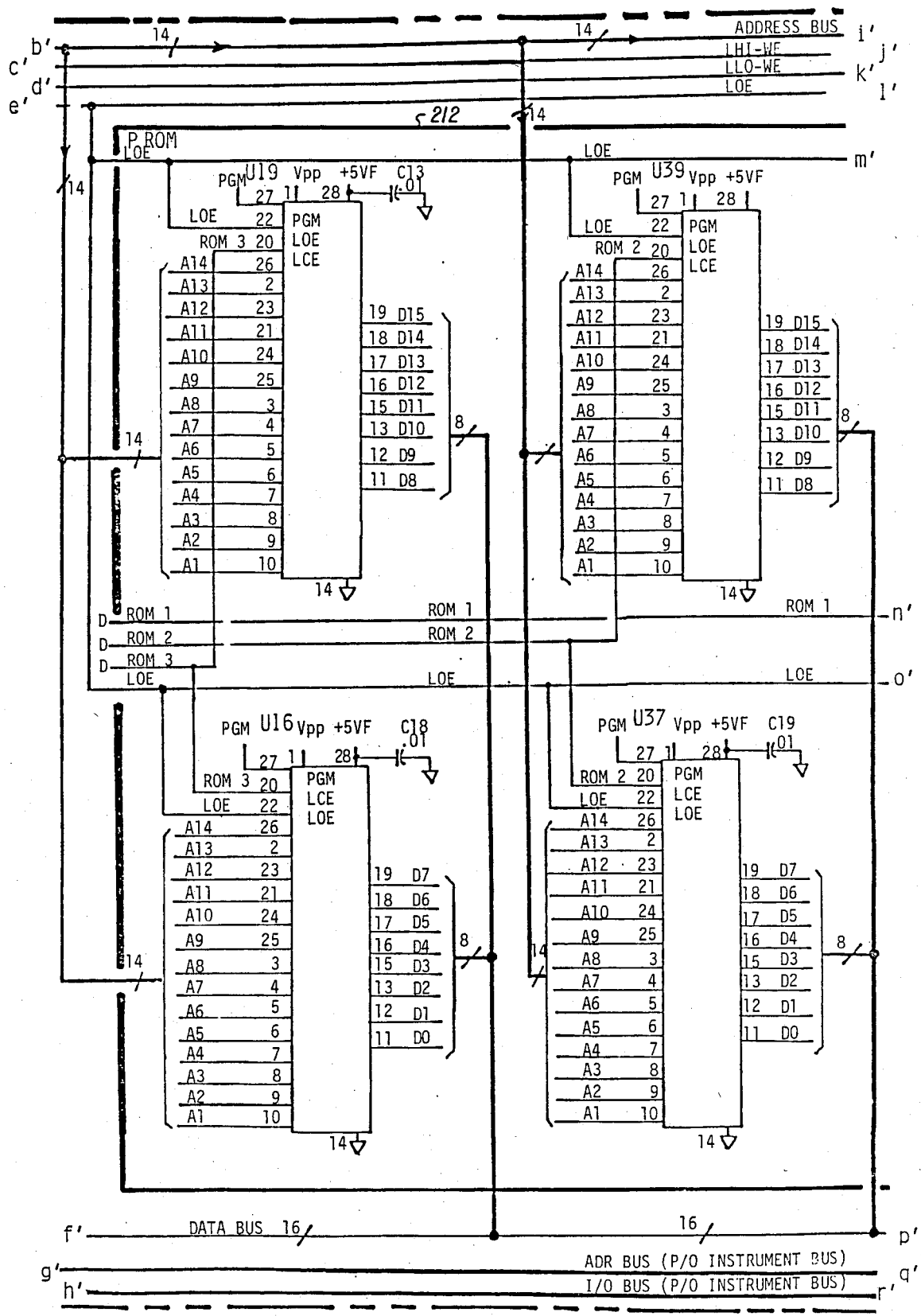
Figure 2D:
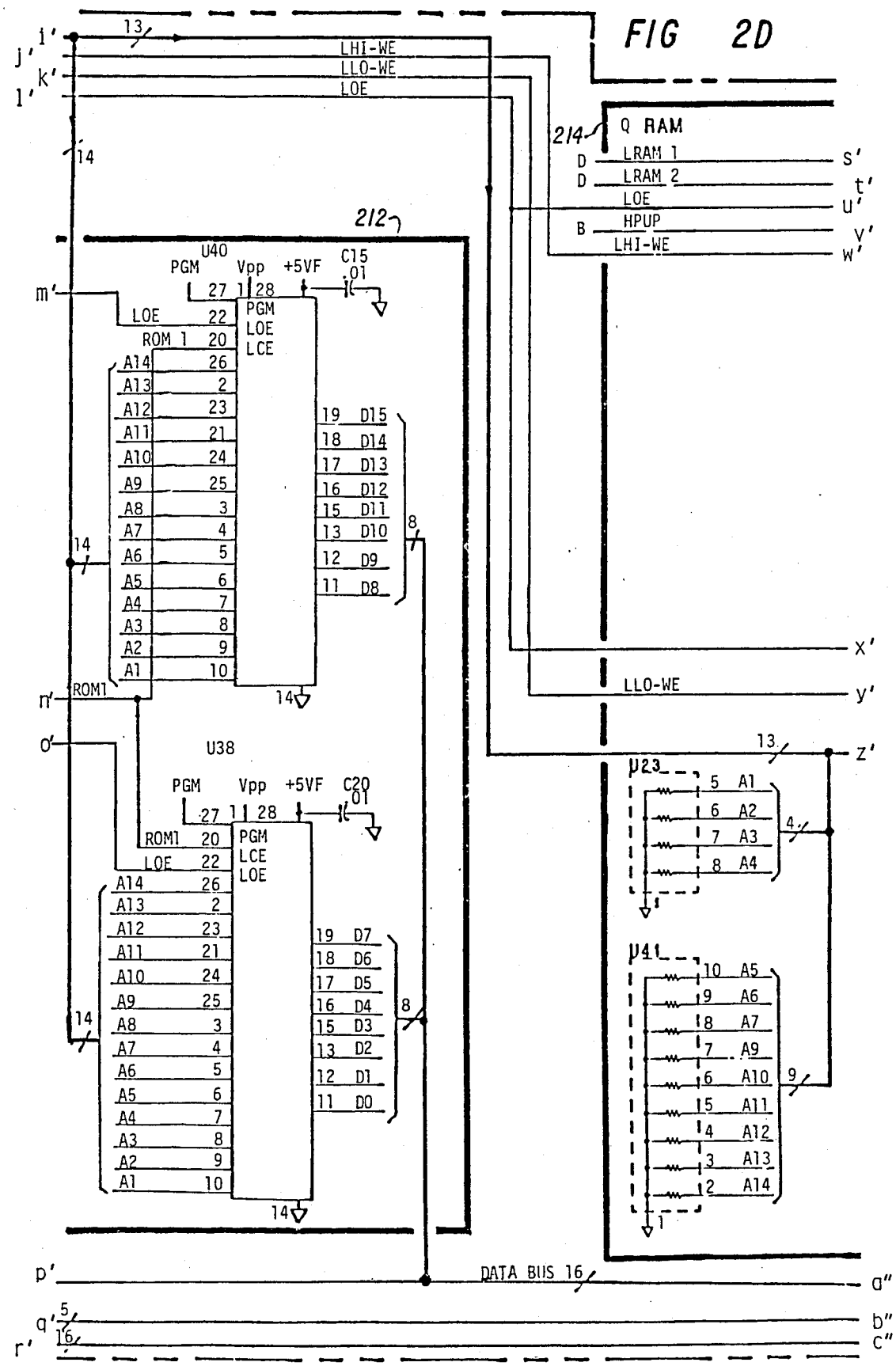
Figure 2E:
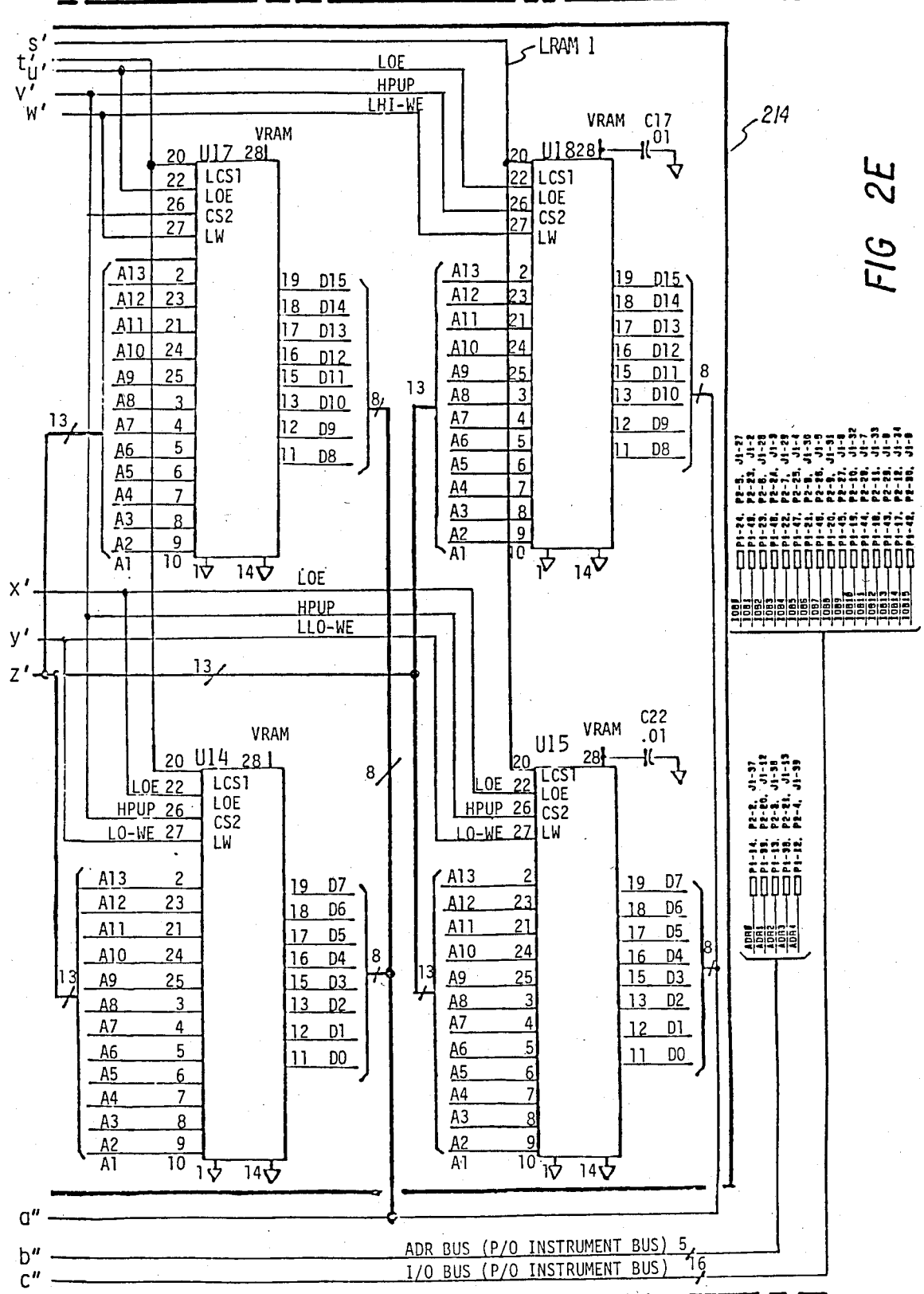

List of Integrated Circuits in FIGS. 1 and 2

| Block Name and Ref. No. | I.C. No. | Type |
|---|---|---|
| CLOCK | U25 | XTAL OSC 14.7 MHZ |
| 102 | U27B | 74HC112 |
| | U27A | 74HC112 |
| RESET | U43A | IC LM339 |
| 104 | U43B | IC LM339 |
| | U43C | IC LM339 |
| | U43D | IC LM339 |
| ADDRESS DECODER | U9 | PAL16L8 Programmed |
| 110 | U20 | PAL16R4 Programmed |
| | U28 | 74LS139 |
| ADDRESS DECODE | U7 | 74LS138 |
| 112 | | |
| LT10/LB10 | U11A | 74ALS1032 |
| 118 | U11B | 74ALS1032 |
| BUFFER CONTROLS | U6A | 74LS74 |
| 116 | U6B | 74LS74 |
| ADDRESS AND | U15 | 74LS373 |
| DATA LINE BUFFERS | U16 | 74LS646 |
| 114 | U17 | 74LS646 |
| PERIPHERAL INTERFACE AND TIMER | U21 | MC68230 |
| 120 | | |
| HP-IB | U14 | 74LS244 |
| 122 | U18 | TMS9914A |
| | U19 | 75160 |
| | U20 | 75161 |
| INTERRUPT ENCODER | U22 | 74LS148 |
| 202 | | |
| SELF TEST | U12 | 74LS374 |
| 204 | U13 | 74LS374 |
| PROCESSOR | U25 | MC68000 |
| 206 | | |
| SIGNATURE | U24A | 74LS05 |
| ANALYSIS | U24B | 74LS05 |
| 210 | U24C | 74LS05 |
| | U24D | 74LS05 |
| ROM | U19 | 27256-20 |
| 212 | U16 | 27256-20 |
| | U39 | 27256-20 |
| | U37 | 27256-20 |
| | U40 | 27256-20 |
| | U38 | 27256-20 |
| RAM | U17 | HM6264LP-15 |
| 214 | U14 | HM6264LP-15 |
| | U18 | HM6264LP-15 |
| | U15 | HM6264LP-15 |

What is claimed is:

1. A swept frequency measurement apparatus comprising:

input means for receiving a signal;

sweep generating means for generating a sweep signal and an end of sweep signal;

variable frequency measurement means connected to the input means and the sweep generating means for producing a measurement signal in response to receipt of a signal by the input means;

signal processing means connected to the variable frequency measurement means for processing the measurement signal to produce a processed signal;

display means connected to the signal processing means for displaying processed signals;

user input means for inputting by a user a command string corresponding to a sequence of operations to be performed;

storage means for storing the command string; and control means connected to the storage means, the signal processing means and the sweep generating means for executing the command string to cause the stored sequence of operations to be performed in response to the end of sweep signal.

2. A method of making swept frequency measurements comprising the steps of:

inputting by a user a command string corresponding to a sequence of operations to be performed on a measured signal resulting from a swept frequency measurement;

storing the command string;

receiving an electrical signal to be measured;

generating a sweep signal and an end of sweep signal;

performing a swept frequency measurement on the received electrical signal to produce the measured signal in response to the sweep signal; and automatically executing the command string to perform the sequence of operations on the measured signal in response to the end of sweep signal.

* * * * *